(12) United States Patent
Gao et al.

(10) Patent No.: US 10,181,327 B2
(45) Date of Patent: Jan. 15, 2019

(54) SPEECH GAIN QUANTIZATION STRATEGY

(75) Inventors: Yang Gao, Mission Viejo, CA (US); Adil Benyassine, Irvine, CA (US)

(73) Assignee: Nytell Software LLC, Wilmington, DE (US)

( * ) Notice: Subject to any disclaimer, the term of this patent is extended or adjusted under 35 U.S.C. 154(b) by 0 days.

(21) Appl. No.: 12/381,036

(22) Filed: Mar. 6, 2009

(65) Prior Publication Data

US 2009/0177464 A1 Jul. 9, 2009

Related U.S. Application Data

(63) Continuation of application No. 11/827,916, filed on Jul. 12, 2007, which is a continuation of application (Continued)

(51) Int. Cl.
*G10L 19/00* (2013.01)
*G10L 19/083* (2013.01)
(Continued)

(52) U.S. Cl.
CPC .......... *G10L 19/00* (2013.01); *G10L 19/083* (2013.01); *G10L 19/167* (2013.01); *G10L 19/18* (2013.01); *H03G 3/00* (2013.01); *G10L 19/24* (2013.01)

(58) Field of Classification Search
USPC ................................................ 704/219–223
See application file for complete search history.

(56) References Cited

U.S. PATENT DOCUMENTS

| 4,720,861 A | 1/1988 | Bertrand |
| 4,969,192 A * | 11/1990 | Chen et al. ............. G10L 19/06 704/222 |

(Continued)

FOREIGN PATENT DOCUMENTS

| CA | 2239294 | 11/1999 |
| EP | 0 607 989 B1 | 9/1999 |

(Continued)

OTHER PUBLICATIONS

Gerson, I. And Jasiuk M., "Vector Sum Excited Linear Prediction (VSELP) Speech Coding At 8 KBPS", IEEE 1990, pp. 461-464.
(Continued)

*Primary Examiner* — Michael N Opsasnick
(74) *Attorney, Agent, or Firm* — Meyertons, Hood, Kivlin, Kowert & Goetzel, P.C.

(57) ABSTRACT

A speech encoder that analyzes and classifies each frame of speech as being periodic-like speech or non-periodic like speech where the speech encoder performs a different gain quantization process depending if the speech is periodic or not. If the speech is periodic, the improved speech encoder obtains the pitch gains from the unquantized weighted speech signal and performs a pre-vector quantization of the adaptive codebook gain $G_P$ for each subframe of the frame before subframe processing begins and a closed-loop delayed decision vector quantization of the fixed codebook gain $G_C$. If the frame of speech is non-periodic, the speech encoder may use any known method of gain quantization. The result of quantizing gains of periodic speech in this manner results in a reduction of the number of bits required to represent the quantized gain information and for periodic speech, the ability to use the quantized pitch gain for the current subframe to search the fixed codebook for the fixed codebook excitation vector for the current subframe. Alternatively, the new gain quantization process which was used only for periodic signals may be extended to non-periodic signals as well. This second strategy results in a slightly higher bit rate than that for periodic signals that use the new gain quantization strategy, but is still lower than the prior art's bit rate. Yet another alternative is to use the new gain quantization process for all speech signals without distinguishing between periodic and non-periodic signals.

15 Claims, 8 Drawing Sheets

Related U.S. Application Data

No. 10/888,420, filed on Jul. 10, 2004, now Pat. No. 7,260,522, which is a continuation of application No. 09/574,396, filed on May 19, 2000, now Pat. No. 6,782,360.

(51) Int. Cl.
| | |
|---|---|
| *G10L 19/18* | (2013.01) |
| *G10L 19/16* | (2013.01) |
| *H03G 3/00* | (2006.01) |
| *G10L 19/24* | (2013.01) |

(56) References Cited

U.S. PATENT DOCUMENTS

| | | | |
|---|---|---|---|
| 5,293,449 A | 3/1994 | Tzeng | |
| 5,307,441 A * | 4/1994 | Tzeng | 704/222 |
| 5,414,796 A * | 5/1995 | Jacobs et al. | G10L 19/015 704/221 |
| 5,495,555 A * | 2/1996 | Swaminathan | 704/207 |
| 5,548,680 A | 8/1996 | Cellario | |
| 5,596,676 A * | 1/1997 | Swaminathan et al. | 704/208 |
| 5,651,091 A * | 7/1997 | Chen | 704/223 |
| 5,657,420 A * | 8/1997 | Jacobs et al. | 704/223 |
| 5,664,055 A * | 9/1997 | Kroon | G10L 19/083 704/223 |
| 5,680,507 A * | 10/1997 | Chen | 704/223 |
| 5,699,485 A * | 12/1997 | Shoham | 704/223 |
| 5,732,389 A * | 3/1998 | Kroon et al. | 704/223 |
| 5,734,789 A * | 3/1998 | Swaminathan et al. | 704/206 |
| 5,745,523 A | 4/1998 | Dent et al. | |
| 5,751,903 A | 5/1998 | Swaminathan et al. | |
| 5,765,127 A * | 6/1998 | Nishiguchi et al. | 704/208 |
| 5,778,338 A | 7/1998 | Jacobs et al. | |
| 5,826,226 A | 10/1998 | Ozawa | |
| 5,864,798 A | 1/1999 | Miseki | |
| 5,878,388 A * | 3/1999 | Nishiguchi et al. | 704/214 |
| 5,890,108 A | 3/1999 | Yeldener | |
| 5,911,128 A | 6/1999 | DeJaco | |
| 5,960,388 A * | 9/1999 | Nishiguchi et al. | 704/208 |
| 6,006,178 A * | 12/1999 | Taumi et al. | 704/222 |
| 6,014,621 A * | 1/2000 | Chen | 704/220 |
| 6,014,622 A | 1/2000 | Su et al. | |
| 6,029,125 A | 2/2000 | Hagen et al. | |
| 6,058,359 A | 5/2000 | Hagen | |
| 6,064,962 A | 5/2000 | Oshikiri | |
| 6,199,035 B1 | 3/2001 | Lakaniemi | |
| 6,240,385 B1 * | 5/2001 | Foodeei | 704/220 |
| 6,246,979 B1 | 6/2001 | Carl | |
| 6,345,248 B1 * | 2/2002 | Su et al. | G10L 19/08 704/223 |
| 6,470,309 B1 | 10/2002 | Mccree | |
| 6,507,814 B1 | 1/2003 | Gao | |
| 6,691,084 B2 * | 2/2004 | Manjunath et al. | 704/221 |
| 6,738,739 B2 | 5/2004 | Gao | |
| 6,775,649 B1 | 8/2004 | DeMartin | |
| 6,782,360 B1 | 8/2004 | Gao et al. | |
| 6,804,218 B2 | 10/2004 | El-Maleh | |
| 6,804,639 B2 | 10/2004 | Ehara | |
| 6,959,274 B1 * | 10/2005 | Gao et al. | 704/219 |
| 7,054,807 B2 | 5/2006 | Mittal et al. | |
| 7,260,522 B2 | 8/2007 | Gao et al. | |
| 7,590,096 B2 | 9/2009 | El-Maleh | |
| 7,613,606 B2 * | 11/2009 | Makinen | 704/221 |
| 2005/0258983 A1 * | 11/2005 | Jabri et al. | 341/50 |

FOREIGN PATENT DOCUMENTS

| | | |
|---|---|---|
| EP | 2 259 255 | 12/2010 |
| JP | 6511320 | 12/1994 |
| JP | 8272398 | 10/1996 |
| JP | 8509348 | 10/1996 |
| JP | 9503874 | 4/1997 |
| JP | 2010-181889 | 8/2010 |
| JP | 2010-181890 | 8/2010 |
| JP | 2010-181891 | 8/2010 |
| JP | 2010-181892 | 8/2010 |
| JP | 2010-181893 | 8/2010 |

OTHER PUBLICATIONS

Kataoka, A.; Moriya, T.; Ikedo, J.; and Hayashi, S., "LSP and Gain Quantization for CS-ACELP Speech Coder", NTT Review vol. 8 No. 4, Jul. 1996, pp. 30-35.
Buzo, A.; Gray, A., Jr.; Gray, R.; and Markel, J., "Speech Coding Based Upon Vector Quantization", Acoustics, Speech, and Signal Processing, IEEE Transactions vol. 28 Issue 5, Oct. 1980, pp. 562-574.
*Enhanced Variable Rate Codec, Speech Service Option 3 for Wideband Spread Spectrum Digital Systems*, TIA/EIA/IS-127 (Jan. 1997).
*Dual Rate Speech Coder for Multimedia Communications Transmitting at 5.3 and 6.3 kbit/s*, ITU-T Recommendation G.723.1, 1-27 (Mar. 1996).
*Coding of Speech at 8 kbit/s Using Conjugate-Structure Algebraic-Code-Excited Linear-Prediction (CS-ACELP)*, ITU-T Recommendation G.729, 1-35 (Mar. 1996).
*Digital cellular telecommunications system (Phase 2); Enhanced Full Rate (EFR) speech transcoding; (GSM 06.60 version 4.1.0)*, European Telecommunications Standards Institute Draft EN 301 245 V4.1.0, 1-47 (Jun. 1998).
Ekudden, et al., *The Adaptive Multi-Rate Speech Coder*, Ericsson Research, 117-119 (1999).
Defendants' Disclosure of Claim Terms and Proposed Constructions, Case 3:09-cv-00447-REP, Document 188, Filed Dec. 14, 2009, pp. 1-8.
U.S Civil Docket Index for Case #: 3:09-cv-00447-REP, As of: Mar. 14, 2011 05:44 PM EDT, pp. 1-38.
File History for U.S. Appl. No. 09/663,002 Sep. 15, 2000.
File History for U.S. Appl. No. 11/251,179 Oct. 13, 2005.
File History for U.S. Appl. No. 12/220,480 Jul. 23, 2008.
Vien V. Nguyen; Vladimir Goncharoff, and John Damoulakis, "Correcting Spectral Envelope Shifts in Linear Predictive Speech Compression Systems", Proceedings of the Military Communications Conference (Milcom '90), vol. 1, 1990, pp. 354-358.
Masaaki Honda, "Speech Coding Using Waveform Matching Based on LPC Residual Phase Equalization", International Conference on Acoustics, Speech & Signal Processing (ICASSP '90), vol. 1, pp. 213-216.
File History for U.S. Appl. No. 12/321,934 Jan. 26, 2009.
File History for U.S. Appl. No. 12/069,973 Feb. 14, 2008.
Changchun, Two Kinds of Pitch Predictors in Speech Compressing Coding, Journal of Electronics, vol. 14 No. 3 (Jul. 1997).
LeBlanc, Efficient Search and Design Procedures for Robust Multi-Stage VQ of LPC Parameters for 4 kb/s Speech Coding, IEEE Transactions on Speech and Audio Processing, vol. 1, No. 4, (Oct. 1993).
Ney, Dynamic Programming Algorithm for Optimal Estimation of Speech Parameter Contours, IEEE Transactions on Systems, Man, and Cybernetics, vol. SMC-13, No. 3 (Mar./Apr. 1983).
Shlomot, Delayed Decision Switched Prediction Multi-Stage LSF Quantization, Rockwell Telecommunication 1995.
File History for U.S. Appl. No. 60/097,569 Aug. 24, 1998.
File History for U.S. Appl. No. 12/218,242 Jul. 11, 2008.
TIA/EIA IS-641-A, TDMA Cellular/PCS— Radio Interface Enhanced Full-Rate Voice Codec, Revision A 1999.
Paksoy, et al "A Variable-Rate Multimodal Speech Coder with Gain-Matched Analysis-By-Synthesis" Corporate Research, Texas Instruments, Dallas, TX, Copyright 1997, pp. 751-754.
"General Aspects of Digital Transmission Systems: Dual Rate Speech Coder for Multimedia Communications Transmitting at 5.3 and 6.3 kbit/s" ITU-T Recommendation G.723.1 (03/96) Geneva, 1996 33 Pgs.
Paksoy, et al "Variable Bit-Rate CELP Coding of Speech with Phonetic Classification (1)" Center for Information Processing Research. Department of Electrical Computer Engineering, University of California Santa Barbara, CA 93106-USA 11 pgs.

(56) References Cited

OTHER PUBLICATIONS

Di Francesco, et al "Variable Rate Speech Coding with Online Segmentation and Fast Algebraic Codes" Frnce Telecom, CNET LAA/TSS/CMC. 22301 Lannion Cedex, France pp. 233-236.
"Digital Cellular Telecommunications System (Phase 2); Enhanced Full Rate (EFR) speech processing functions; General description (GSM 06.51 version 4.0.1)" European Telecommunications Standards Institute, Global System for Mobile Telecommunications. Dec. 1997 pp. 1-11.
"Enhanced Variable Rate Codec, Speech Service Option 3 for Wideband Spread Spectrum Digital Systems" TIA/EIA Interim Standard. Telecommunications Industry Association. Jan. 1997. pp. 1-142.
Kleijn, et al "Improved Speech Quality and Efficient Vector Quantization" AT&T Bell Laboratories, Naperville, IL 1988. pp. 155-158.
Cellario, et al "CELP Coding at Variable Rate" CSELT Via G. Reiss Romoli 274, 10148 Torino-Italy. vol. 5. No. 5 Sep.-Oct. 1994 pp. 69-80.
Lupini, et al "A Multi-Mode Variable Rate CELP Coder Based on Frame Classification" Communications Science Laboratory, School of Engineering, Science, Simon Fraser University, B.C. Canada, MPR TelTech Ltd., Burnaby, B.C., Canada 1993 pp. 406-409.
Ojala, Pasi "Toll Quality Variable-Rate Speech Codec" Speech and Audio Systems Laboratory, Nokia Research Center, Tampere, Finland Copyright 1997 pp. 747-750.
Das, et al "A Variable-Rate Natural-Quality Parametric Speech Coder" Center for Information Processing Research Department of Electrical & Computer Engineering. University of California, Santa Barbara, CA 93106 copyright 1994 pp. 216-220.
Chen, et al "Adaptive Postfiltering for Quality Enhancement of Codec Speech" IEEE Transactions on Speech and Audio processing, vol. 3, No. 1, Jan. 1995 pp. 59-71.
Kleijn and Paliwal (Editors) "Speech Coding and Synthesis" 1995.
Digital Cellular Telecommunications System: Enhanced Full Rate (EFR) Speech Transcoding (GSM 06.60) Global System for Mobile Telecommunications. ETS 300 726 Mar. 1997.
Paksoy, et al "Variable Rate Speech Coding for Multiple Access Wireless Networks" Center for Information Processing Research, Dept. Of Electrical and Computer Engineering. University of California, Santa Barbara, CA 93106 (1994) pp. 47-50.
ITU-T G.723.1 Annex A "Series G: Transmission Systems and Media: Digital Transmission systems-Terminal equipments-Coding of analogue signals by methods other than PCM" Dual rate speech coder for multimedia communications transmitting at 5.3 and 6.3 kbits Annex A: Silence compression scheme Nov. 1996.
"On AMR Codec Performance" Nokia, Apr. 16, 1997 pp. 1-6 (Antipolis, Sophia, France 1997).
"On AMR Codec Performance: Background Noise" Nokia, Jun. 25, 1997, Oxford, UK pp. 1-6 (ETSI SMG11 AMR #5).
"TDMA Cellular/PCS-Radio Interface-Enhanced Full-Rate Speech Codec" TIA/EIA Interim Standard May 1996 pp. 1-48.
Vary, et al "Digitale Sprachsignal-verarbeitung".
Benesty, et al "Speech Processing".
Chu, Wai C. "Speech Coding Algorithms: Foundation and Evolution of Standardized Coders".
Kondoz, A.M, "Digital Speech: Coding for low bit rate communication systems" John Wiley & Sons, Ltd, The Atrium, Southern Gate, Chichester, West Sussex P019 8SQ, England Copyright 2004.
Figueiras-Vidal, Anibal R. "Digital Signal Processing in Telecommunications" ETSI Telecom-UPM, Ciudad Universitaria, 28040 Madrid, Spain ISBN No. 3-540-76037-7.
Vainio, et al, "GSM EFR Based Multi-Rate Codec Family" Nokia Research Center, Tampere, Finland 4 Pgs.
Appendix 6, Invalidity Contentions.
Appendix 1-H, Invalidity Contentions.
Defendant's Invalidity Contentions.
Appendix 1-A, Invalidity Contentions.
Appendix 1-B, Invalidity Contentions.
Appendix 1-C, Invalidity Contentions.
Appendix 1-D, Invalidity Contentions.
Appendix 1-E, Invalidity Contentions.
Appendix 1-F, Invalidity Contentions.
Appendix 1-G, Invalidity Contentions.
Appendix 1-I, Invalidity Contentions.
Appendix 1-J, Invalidity Contentions.
Appendix 2-A, Invalidity Contentions.
Appendix 2-B, Invalidity Contentions.
Appendix 2-C, Invalidity Contentions.
Appendix 2-D, Invalidity Contentions.
Appendix 2-E, Invalidity Contentions.
Appendix 2-F, Invalidity Contentions.
Appendix 2-G, Invalidity Contentions.
Appendix 2-H, Invalidity Contentions.
Appendix 2-I, Invalidity Contentions.
Appendix 2-J, Invalidity Contentions.
Appendix 3-A, Invalidity Contentions.
Appendix 3-B, Invalidity Contentions.
Appendix 3-C, Invalidity Contentions.
Appendix 3-D, Invalidity Contentions.
Appendix 3-E, Invalidity Contentions.
Appendix 3-F, Invalidity Contentions.
Appendix 3-G, Invalidity Contentions.
Appendix 3-H, Invalidity Contentions.
Appendix 3-I, Invalidity Contentions.
Appendix 3-J, Invalidity Contentions.
Appendix 3-K, Invalidity Contentions.
Appendix 4-A, Invalidity Contentions.
Appendix 4-B, Invalidity Contentions.
Appendix 4-C, Invalidity Contentions.
Appendix 4-D, Invalidity Contentions.
Appendix 4-E, Invalidity Contentions.
Appendix 4-F, Invalidity Contentions.
Appendix 5-A, Invalidity Contentions.
Appendix 5-B, Invalidity Contentions.
Appendix 5-C, Invalidity Contentions.
Appendix 5-D, Invalidity Contentions.
"SONY Ericsson Mobile Communications (USA) Inc. and SONY Ericsson Mobile Communications AB's Response to WIAV Solutions LLC's Disclosure of Asserted Claims and Infringement Contentions".
Appendix 1: MMI's Noninfringement Contentions for U.S. Pat. No. 6,256,606.
Appendix 1- Nokia's Noninfringement Contentions for U.S. Pat. No. 6,625,606.
Appendix 2: MMI's Noninfringement Contentions for U.S. Pat. No. 7,120,578.
Appendix 2-Nokia's Noninfringement Contentions for U.S. Pat. No. 7,120,578.
Appendix 3: MMI's Noninfringement Contentions for U.S. Pat. No. 6,385,573.
Appendix 3- Nokia's Noninfringement Contentions for U.S. Pat. No. 6,385,573.
Appendix 4: MMI's Noninfringement Contentions for U.S. Pat. No. 7,266,493.
Appendix 4: Nokia's Noninfringement Contentions for U.S. Pat. No. 7,266,493.
Appendix 5: MMI's Noninfringement Contentions for U.S. Pat. No. 6,507,814.
Appendix 5: Nokia's Noninfringement Contentions for U.S. Pat. No. 6,507,814.
Motorola Mobility, Inc.'s Response to Wiav Solutions LLC's Disclosure of Asserted Claims and Infringement Contentions.
Nokia Inc. And Nokia Corporation's Response to Wiav Solutions Llc's Disclosure of Asserted Claims and Infringement Contentions.
Appendix 1- Sony Ericsson's Noninfringement Contentions for U.S. Pat. No. 6,625,606.
Appendix 2- Sony Ericsson's Noninfringement Contentions for U.S. Pat. No. 7,120,578.
Appendix 3- Sony Ericsson's Noninfringement Contentions for U.S. Pat. No. 6,385,573.
Appendix 4- Sony Ericsson's Noninfringement Contentions for U.S. Pat. No. 7,266,493.

(56) References Cited

OTHER PUBLICATIONS

Appendix 5- Sony Ericsson's Noninfringement Contentions for U.S. Pat. No. 6,507,814.
TIA/EIA Interim Standard, TDMA Cellular/Pcs—Radio Interface—Enhanced Full-Rate Speech Codec, TIA/EIA/IS-641 (May 1996) ("TDMA IS-641").
Chen, "Low-Delay Coding of Speech" Speech Coding Research Department, AT&T Bell Laboratories (1995).
W.B. Kleijn and K.K. Paliwal (Editors), Speech Coding and Synthesis, Elsevier Science B.V.; Kroon and W.B. Kleijn (Authors), Chapter 3: Linear-Prediction Based on Analysis-by-Synthesis Coding, 1995, pp. 81-113.

* cited by examiner

THE PARAMETERS OF THE ALGORITHM ARE REPRESENTED BY 80 BITS PER FRAME RESULTING IN A BIT-RATE OF 4 KBIT/S. A DETAILED OVERVIEW OF THE BIT ALLOCATION IS PRESENTED IN TABLE 1.

TABLE 1: DETAILED BIT ALLOCATION

| PARAMETER | BITS PER 20 MS | |
|---|---|---|
| | MODE 0 (2 SUBFRAMES) | MODE 1 (3 SUBFRAMES) |
| LSFs | PREDICTOR SWITCH<br>1ST STAGE<br>2ND STAGE<br>3RD STAGE | 1 BIT<br>7 BITS<br>7 BITS<br>6 BITS<br>21 BITS |
| MODE | 1 BIT | |
| ADAPTIVE CODEBOOK | 7 BITS/SUBFRAME<br>14 BITS | 7-BIT/FRAME<br>7 BITS |
| FIXED CODEBOOK | 2-PULSE CODEBOOK 16384/SUBFRAME<br>3-PULSE CODEBOOK 8192/SUBFRAME<br>GAUSSIAN CODEBOOK 8192/SUBFRAME<br>32768/SUBFRAME<br>30 BITS | 2-PULSE CODEBOOK 4096/SUBFRAME<br>3-PULSE CODEBOOK 2048/SUBFRAME<br>6-PULSE CODEBOOK 2048/SUBFRAME<br>8192 SUBFRAME<br>13 BITS/SUBFRAME 39 BITS |
| ADAPTIVE CODEBOOK GAIN | 2D VQ/ FRAME 7 BITS/SUBFRAME | 3D PRE VQ/FRAME 4 BITS |
| FIXED CODEBOOK GAIN | 14 BITS | 3D DELAYED VQ FRAME 8-BITS |
| TOTAL | 80 BITS | 80 BITS |

Fig. 10

SPEECH GAIN QUANTIZATION STRATEGY

The present application is a Continuation of U.S. application Ser. No. 11/827,916, filed Jul. 12, 2007, which is a Continuation of U.S. application Ser. No. 10/888,420, filed Jul. 10, 2004, now U.S. Pat. No. 7,260,522, which is a Continuation of U.S. application Ser. No. 09/574,396, filed May 19, 2000, now U.S. Pat. No. 6,782,360.

INCORPORATION BY REFERENCE

The following U.S. patent applications are hereby incorporated by reference in their entireties and made part of the present application:

U.S. patent application Ser. No. 09/156,650, titled "Speech Encoder Using Gain Normalization That Combines Open And Closed Loop Gains," filed Sep. 18, 1998; and Provisional U.S. Patent Application Ser. No. 60/155,321 titled "4 kbits/s Speech Coding," filed Sep. 22, 1999.

BACKGROUND OF THE INVENTION

The field of the present invention relates generally to the coding of speech in voice communication systems and, more particularly to an improved code-excited linear prediction coding system and method of coding the gain quantization parameters of a speech signal with fewer bits.

To model basic speech sounds, speech signals are sampled over time and stored in frames as a discrete waveform to be digitally processed. However, in order to increase the efficient use of the communication bandwidth for speech, speech is coded before being transmitted especially when speech is intended to be transmitted under limited bandwidth constraints. Numerous algorithms have been proposed for the various aspects of speech coding. In coding speech, the speech coding algorithm tries to represent characteristics of the speech signal in a manner which requires less bandwidth. For example, the speech coding algorithm seeks to remove redundancies in the speech signal. A first step is to remove short-term correlations. One type of signal coding technique is linear predictive coding (LPC). In using a LPC approach, the speech signal value at any particular time is modeled as a linear function of previous values. By using a LPC approach, short-term correlations can be reduced and efficient speech signal representations can be determined by estimating and applying certain prediction parameters to represent the signal. After the removal of short-term correlations in a speech signal, a LPC residual signal remains. This residual signal contains periodicity information that needs to be modeled. The second step in removing redundancies in speech is to model the periodicity information. Periodicity information may be modeled by using pitch prediction. Certain portions of speech have periodicity while other portions do not. For example, the sound "aah" has periodicity information while the sound "shhh" has no periodicity information.

In applying the LPC technique, a conventional source encoder operates on speech signals to extract modeling and parameter information to be coded for communication to a conventional source decoder via a communication channel. One way to code modeling and parameter information into a smaller amount of information is to use quantization. Quantization of a parameter involves selecting the closest entry in a table or codebook to represent the parameter. Thus, for example, a parameter of 0.125 may be represented by 0.1 if the codebook contains 0, 0.1, 0.2, 0.3, etc. Quantization includes scalar quantization and vector quantization.

In scalar quantization, one selects the entry in the table or codebook that is the closest approximation to the parameter, as described above. By contrast, vector quantization combines two or more parameters and selects the entry in the table or codebook which is closest to the combined parameters. For example, vector quantization may select the entry in the codebook that is the closest to the difference between the parameters. A codebook used to vector quantize two parameters at once is often referred to as a two-dimensional codebook. A n-dimensional codebook quantizes n parameters at once.

In CELP (Code Excited Linear Prediction) speech coding, there are two types of gain. The first type of gain is the pitch gain $G_P$, also known as the adaptive codebook gain. The adaptive codebook gain is sometimes referred to, including herein, with the subscript "a" instead of the subscript "p". The second type of gain is the fixed codebook gain $G_C$. Speech coding algorithms have quantized parameters including the adaptive codebook gain and the fixed codebook gain. Once coded, the parameters representing the input speech signal are transmitted to a transceiver.

At the transceiver, a decoder receives the coded information. Because the decoder is configured to know the manner in which speech signals are encoded, the decoder decodes the coded information to reconstruct a signal for playback that sounds to the human ear like the original speech.

Therefore, transmitting the coded modeling and parameter information to the decoder requires a certain amount of valuable communication channel bandwidth. In order to increase the efficient use of the bandwidth, improvements to the manner in which modeling and parameter information is coded are needed. Coding algorithms need to reduce the amount of information in bits that must be transmitted over the communication channel. However, there is a countervailing need for a coding algorithm that not only reduces the amount of information in bits that must be communicated over the channel, but also maintains a high quality level of the reproduced speech.

SUMMARY OF THE INVENTION

Various separate aspects of the present invention can be found in a speech encoding system and method that uses an analysis-by-synthesis coding approach on a speech signal. The speech encoding system has an encoder processor and a plurality of codebooks that generate excitation vectors. The speech encoder analyzes and classifies each frame of speech into periodic-like speech or non-periodic like speech. For simplicity throughout this application and claims, periodic-like signals and periodic signals are referred to as "periodic" signals while non-periodic speech is referred to as "non-periodic" or "not periodic" signals.

There are at least three main alternative embodiments as described below. A first embodiment uses a new gain quantization strategy for periodic speech and uses a known gain quantization approach for non-periodic speech. The second embodiment uses the new gain quantization strategy for both periodic speech and non-periodic speech where the bit rate (number of bits per second) for non-periodic speech is greater than that for periodic speech, but less than the bit rate resulting from known gain quantization approaches. The third embodiment uses the new gain quantization strategy for all speech which results in a bit rate equivalent to that for non-periodic speech in the second embodiment.

The first embodiment is described first below, followed by the second and third embodiments. If the speech is periodic, the pitch gains are derived from the original unquantized weighted speech signal before closed loop subframe processing begins. This is different from the traditional way where the pitch gains are derived from the closed loop subframe processing. A "closed loop" process finds the vector in a codebook that generates synthesized speech that is closest perceptually to the original input speech. By contrast, an "open loop" process finds the vector in a codebook that is closest to the gain vector (or a transformed gain vector such as the log of the gain vector). In an open loop process, the closeness of two vectors does not depend on how perceptually close the synthesized speech is to the original speech. The speech encoder performs a different gain quantization process depending if the speech is periodic or not. If the speech is periodic, the improved speech encoder performs the following two gain quantizations: (1) perform a pre-vector quantization of the adaptive codebook gain $G_P$ for each subframe of the frame which is based on the original unquantized weighted speech; this quantization occurs before the closed loop subframe processing begins; and (2) perform a closed-loop delayed decision vector quantization of the fixed codebook gain $G_C$ at the end of the subframe processing.

A first, separate aspect of the present invention is a speech encoder that classifies speech into periodic-like and non-periodic like speech and processes gain quantization of periodic-like speech differently than that of non-periodic like speech.

A second, separate aspect of the present invention is a speech encoder that performs for each frame of periodic speech a pre-vector quantization of the $G_P$ for each subframe of the frame and performs a closed-loop delayed decision vector quantization of the $G_C$.

A third, separate aspect of the present invention is a speech encoder that performs a closed loop delayed decision vector quantization of the $G_C$ for periodic speech.

A fourth, separate aspect of the present invention is a speech encoder that reduces the number of bits required to vector quantize gain information in periodic speech.

A fifth, separate aspect of the present invention is a speech encoder that performs frame-based processing on a speech signal and then mode-dependent subframe processing.

A sixth, separate aspect of the present invention is a speech encoder that obtains the quantized pitch gain for the current subframe from the pre-vector quantization process preceding the closed loop subframe processing so that the quantized pitch gain for the current subframe can be used to search the fixed codebook for a fixed codebook excitation vector for the current subframe.

A seventh, separate aspect of the present invention is a speech encoder that derives pitch gains from the original unquantized weighted speech signal before closed loop subframe processing begins, if the speech is periodic.

An eighth, separate aspect of the present invention is a speech encoder that uses the new gain quantization process for periodic signals only and a conventional gain quantization process for non-periodic signals.

A ninth, separate aspect of the present invention is a speech encoder that distinguishes between periodic and non-periodic signals and uses the new gain quantization process for periodic signals and non-periodic signals where more gain quantization bits are allocated to non-periodic signals than to periodic signals.

A tenth, separate aspect of the present invention is a speech encoder that does not distinguish between periodic and non-periodic signals and uses the new gain quantization process for all signals.

An eleventh, separate aspect of the present invention is any of the above separate aspects as adapted for a speech encoder that distinguishes between periodic and non-periodic signals and uses the new gain quantization process for periodic signals and non-periodic signals where more gain quantization bits are allocated to non-periodic signals than to periodic signals.

A twelfth, separate aspect of the present invention is any of the above separate aspects as adapted for a speech encoder that does not distinguish between periodic and non-periodic signals and uses the new gain quantization process for all signals.

Further separate aspects of the present invention can also be found in a method used to code the gain quantization parameters of a speech signal with fewer bits.

A thirteenth, separate aspect of the present invention is a method of quantizing gain information in a speech signal that classifies the speech signal into periodic-like and non-periodic like speech and processes gain quantization of periodic-like speech differently than that of non-periodic like speech.

A fourteenth, separate aspect of the present invention is a method of quantizing gain information in a speech signal that performs for each frame of periodic speech a pre-vector quantization of the $G_P$ for each subframe of the frame and performs a closed-loop delayed decision vector quantization of the $G_C$.

A fifteenth, separate aspect of the present invention is a method of quantizing gain information in a speech signal that performs a closed loop delayed decision vector quantization of the $G_C$ for periodic speech after the subframe processing.

A sixteenth, separate aspect of the present invention is a method of quantizing gain information in a speech signal that reduces the number of bits required to vector quantize gain information in periodic speech.

A seventeenth, separate aspect of the present invention is a method of quantizing gain information in a speech signal that performs frame-based processing on a speech signal and then mode-dependent subframe processing.

An eighteenth, separate aspect of the present invention is a method of quantizing gain information in a speech signal that obtains the quantized pitch gain for the current subframe from the pre-vector quantization process preceding the closed loop subframe processing so that the quantized pitch gain for the current subframe can be used to search the fixed codebook for a fixed codebook excitation vector for the current subframe.

A nineteenth, separate aspect of the present invention is a method of quantizing gain information in a speech signal that derives pitch gains from the original unquantized weighted speech signal before closed loop subframe processing begins, if the speech is periodic.

A twentieth, separate aspect of the present invention is a method of quantizing gain information in a speech signal that distinguishes between periodic and non-periodic signals and uses the new gain quantization process for periodic signals and non-periodic signals where more gain quantization bits are allocated to non-periodic signals than to periodic signals.

A twenty-first, separate aspect of the present invention is a method of quantizing gain information in a speech signal that does not distinguish between periodic and non-periodic signals and uses the new gain quantization process for all signals.

A twenty-second, separate aspect of the present invention is any of the above separate aspects as adapted for a method of quantizing gain information in a speech signal that distinguishes between periodic and non-periodic signals and uses the new gain quantization process for periodic signals and non-periodic signals where more gain quantization bits are allocated to non-periodic signals than to periodic signals.

A twenty-third, separate aspect of the present invention is any of the above separate aspects as adapted for a method of quantizing gain information in a speech signal that does not distinguish between periodic and non-periodic signals and uses the new gain quantization process for all signals.

A twenty-fourth, separate aspect of the present invention is any of the above separate aspects, either individually or in some combination.

Other aspects, advantages and novel features of the present invention will become apparent from the following Detailed Description Of A Preferred Embodiment, when considered in conjunction with the accompanying drawings.

BRIEF DESCRIPTION OF THE DRAWINGS

FIG. 10 is a table illustrating the allocation of parameters by bits of one example embodiment of the speech coding algorithm built in accordance with the present invention.

DETAILED DESCRIPTION OF A PREFERRED EMBODIMENT

First a general description of the overall speech coding and decoding algorithm is described, and then a detailed description of an embodiment of the present invention is provided.

Figure 1:
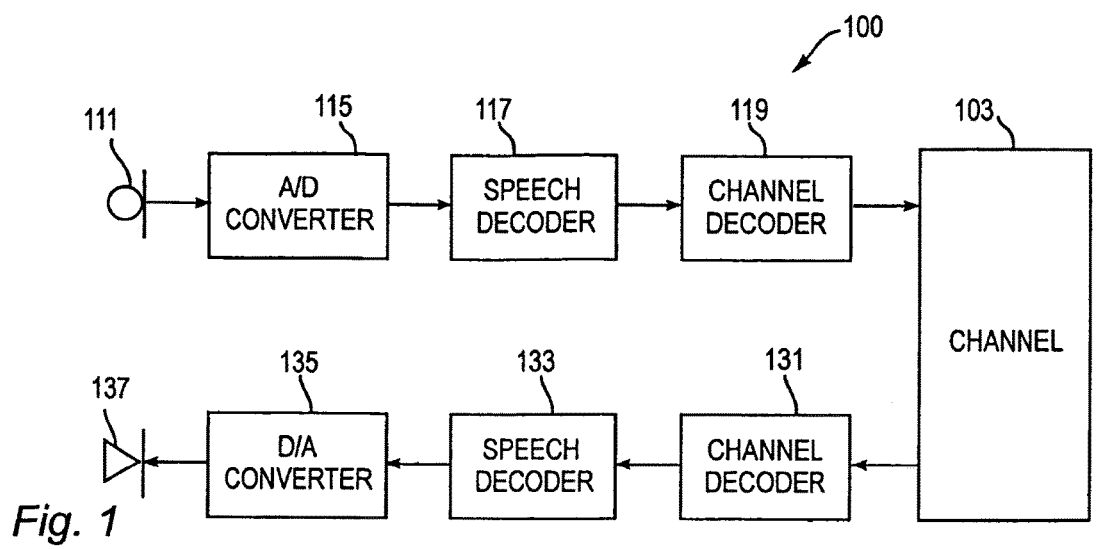
FIG. 1 is a functional block diagram of a speech communication system having a source encoder and source decoder.

FIG. 1 is a schematic block diagram of a speech communication system illustrating the general use of a speech encoder and decoder in a communication system. A speech communication system 100 transmits and reproduces speech across a communication channel 103. Although it may comprise for example a wire, fiber, or optical link, the communication channel 103 typically comprises, at least in part, a radio frequency link that often must support multiple, simultaneous speech exchanges requiring shared bandwidth resources such as may be found with cellular telephones.

A storage device may be coupled to the communication channel 103 to temporarily store speech information for delayed reproduction or playback, e.g., to perform answering machine functions, voiced email, etc. Likewise, the communication channel 103 might be replaced by such a storage device in a single device embodiment of the communication system 100 that, for example, merely records and stores speech for subsequent playback.

In particular, a microphone 111 produces a speech signal in real time. The microphone 111 delivers the speech signal to an A/D (analog to digital) converter 115. The A/D converter 115 converts the analog speech signal into a digital form and then delivers the digitized speech signal to a speech encoder 117.

The speech encoder 117 encodes the digitized speech by using a selected one of a plurality of encoding modes. Each of the plurality of encoding modes uses particular techniques that attempt to optimize the quality of the resultant reproduced speech. While operating in any of the plurality of modes, the speech encoder 117 produces a series of modeling and parameter information (e.g., "speech parameters") and delivers the speech parameters to an optional channel encoder 119.

The optional channel encoder 119 coordinates with a channel decoder 131 to deliver the speech parameters across the communication channel 103. The channel decoder 131 forwards the speech parameters to a speech decoder 133. While operating in a mode that corresponds to that of the speech encoder 117, the speech decoder 133 attempts to recreate the original speech from the speech parameters as accurately as possible. The speech decoder 133 delivers the reproduced speech to a D/A (digital to analog) converter 135 so that the reproduced speech may be heard through a speaker 137.

Figure 2:
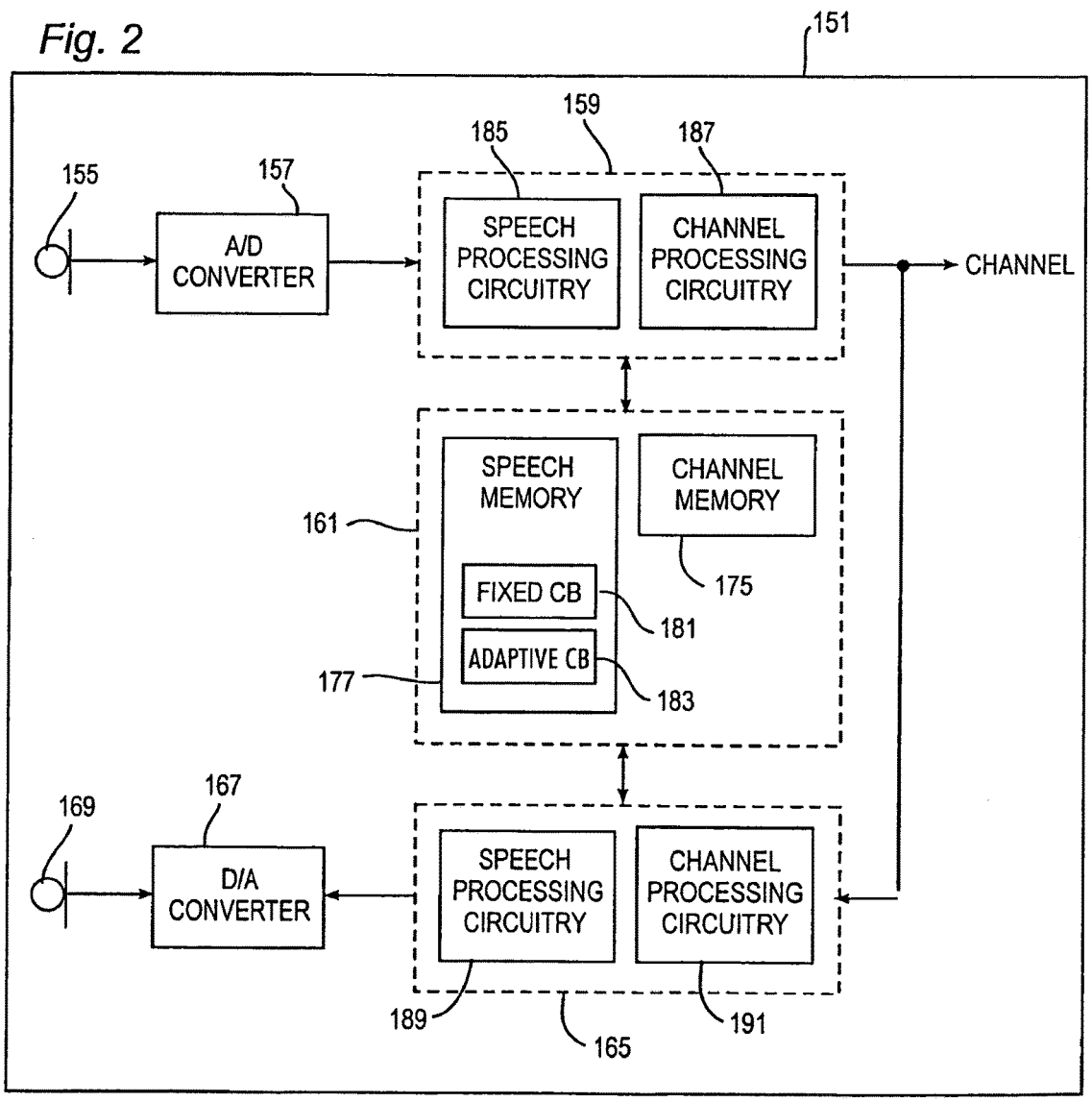
FIG. 2 is a more detailed functional block diagram of the speech communication system of FIG. 1.

FIG. 2 is a functional block diagram illustrating an exemplary communication device of FIG. 1. A communication device 151 comprises both a speech encoder and decoder for simultaneous capture and reproduction of speech. Typically within a single housing, the communication device 151 might, for example, comprise a cellular telephone, portable telephone, computing system, or some other communication device. Alternatively, if a memory element is provided for storing encoded speech information, the communication device 151 might comprise an answering machine, a recorder, voice mail system, or other communication memory device.

A microphone 155 and an A/D converter 157 deliver a digital voice signal to an encoding system 159. The encoding system 159 performs speech encoding and delivers resultant speech parameter information to the communication channel. The delivered speech parameter information may be destined for another communication device (not shown) at a remote location.

As speech parameter information is received, a decoding system 165 performs speech decoding. The decoding system delivers speech parameter information to a D/A converter 167 where the analog speech output may be played on a speaker 169. The end result is the reproduction of sounds as similar as possible to the originally captured speech.

The encoding system 159 comprises both a speech processing circuit 185 that performs speech encoding and an optional channel processing circuit 187 that performs the optional channel encoding. Similarly, the decoding system 165 comprises a speech processing circuit 189 that performs speech decoding and an optional channel processing circuit 191 that performs channel decoding.

Although the speech processing circuit 185 and the optional channel processing circuit 187 are separately illustrated, they may be combined in part or in total into a single unit. For example, the speech processing circuit 185 and the channel processing circuitry 187 may share a single DSP (digital signal processor) and/or other processing circuitry. Similarly, the speech processing circuit 189 and optional the channel processing circuit 191 may be entirely separate or combined in part or in whole. Moreover, combinations in whole or in part may be applied to the speech processing circuits 185 and 189, the channel processing circuits 187 and 191, the processing circuits 185, 187, 189 and 191, or otherwise as appropriate.

The encoding system 159 and the decoding system 165 both use a memory 161. The speech processing circuit 185 uses a fixed codebook 181 and an adaptive codebook 183 of a speech memory 177 during the source encoding process. Similarly, the speech processing circuit 189 uses the fixed codebook 181 and the adaptive codebook 183 during the source decoding process.

Although the speech memory 177 as illustrated is shared by the speech processing circuits 185 and 189, one or more separate speech memories can be assigned to each of the processing circuits 185 and 189. The memory 161 also contains software used by the processing circuits 185, 187, 189 and 191 to perform various functions required in the source encoding and decoding processes.

Before discussing the details of an embodiment of the improvement in speech coding, an overview of the overall speech encoding algorithm is provided at this point. The improved speech encoding algorithm referred to in this specification may be, for example, the eX-CELP (extended CELP) algorithm which is based on the CELP model. The details of the eX-CELP algorithm is discussed in a U.S. patent application assigned to the same assignee, Conexant Systems, Inc., and previously incorporated herein by reference: Provisional U.S. Patent Application Ser. No. 60/155,321 titled "4 kbits/s Speech Coding," filed Sep. 22, 1999.

In order to achieve toll quality at a low bit rate (such as 4 kilobits per second), the improved speech encoding algorithm departs somewhat from the strict waveform-matching criterion of traditional CELP algorithms and strives to capture the perceptually important features of the input signal. To do so, the improved speech encoding algorithm analyzes the input signal according to certain features such as degree of noise-like content, degree of spiky-like content, degree of voiced content, degree of unvoiced content, evolution of magnitude spectrum, evolution of energy contour, evolution of periodicity, etc., and uses this information to control weighting during the encoding and quantization process. The philosophy is to accurately represent the perceptually important features and allow relatively larger errors in less important features. As a result, the improved speech encoding algorithm focuses on perceptual matching instead of waveform matching. The focus on perceptual matching results in satisfactory speech reproduction because of the assumption that at 4 kbits per second, waveform matching is not sufficiently accurate to capture faithfully all information in the input signal. Consequently, the improved speech encoder performs some prioritizing to achieve improved results.

In one particular embodiment, the improved speech encoder uses a frame size of 20 milliseconds, or 160 samples per second, each frame being divided into either two or three subframes. The number of subframes depends on the mode of subframe processing. In this particular embodiment, one of two modes may be selected for each frame of speech: Mode 0 and Mode 1. Importantly, the manner in which subframes are processed depends on the mode. In this particular embodiment, Mode 0 uses two subframes per frame where each subframe size is 10 milliseconds in duration, or contains 80 samples. Likewise, in this example embodiment, Mode 1 uses three subframes per frame where the first and second subframes are 6.625 milliseconds in duration, or contains 53 samples, and the third subframe is 6.75 milliseconds in duration, or contains 54 samples. In both Modes, a look-ahead of 15 milliseconds may be used. For both Modes 0 and 1, a tenth order Linear Prediction (LP) model may be used to represent the spectral envelope of the signal. The LP model may be coded in the Line Spectrum Frequency (LSF) domain using a delayed-decision, switched multi-stage predictive vector quantization scheme.

Mode 0 operates a traditional speech encoding algorithm such as a CELP algorithm. However, Mode 0 is not used for all frames of speech. Instead, Mode 0 is selected to handle frames of all speech other than "periodic-like" speech, as discussed in greater detail below. For convenience, "periodic-like" speech is referred to here as periodic speech, and all other speech is "non-periodic" speech. Such "non-periodic" speech include transition frames where the typical parameters such as pitch correlation and pitch lag change rapidly and frames whose signal is dominantly noise-like. Mode 0 breaks each frame into two subframes. Mode 0 codes the pitch lag once per subframe and has a two-dimensional vector quantizer to jointly code the pitch gain (i.e., adaptive codebook gain) and the fixed codebook gain once per subframe. In this example embodiment, the fixed codebook contains two pulse sub-codebooks and one Gaussian sub-codebook; the two pulse sub-codebooks have two and three pulses, respectively.

Mode 1 deviates from the traditional CELP algorithm. Mode 1 handles frames containing periodic speech which typically have high periodicity and are often well represented by a smooth pitch tract. In this particular embodiment, Mode 1 uses three subframes per frame. The pitch lag is coded once per frame prior to the subframe processing as part of the pitch pre-processing and the interpolated pitch tract is derived from this lag. The three pitch gains of the subframes exhibit very stable behavior and are jointly quantized using pre-vector quantization based on a mean-squared error criterion prior to the closed loop subframe processing. The three reference pitch gains which are unquantized are derived from the weighted speech and are a byproduct of the frame-based pitch pre-processing. Using the pre-quantized pitch gains, the traditional CELP subframe processing is performed, except that the three fixed codebook gains are left unquantized. The three fixed codebook gains are jointly quantized after subframe processing which is based on a delayed decision approach using a moving average prediction of the energy. The three subframes are subsequently synthesized with fully quantized parameters.

The manner in which the mode of processing is selected for each frame of speech based on the classification of the speech contained in the frame and the innovative way in which periodic speech is processed allows for gain quantization with significantly fewer bits without any significant sacrifice in the perceptual quality of the speech. Details of this manner of processing speech are provided below.

Figure 3:
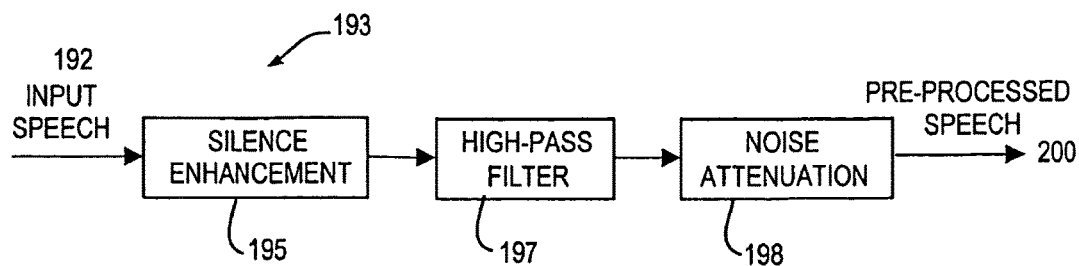
FIG. 3 is a functional block diagram of an exemplary first stage, a speech pre-processor, of the source encoder used by one embodiment of the speech communication system of FIG. 1.
Figure 4:
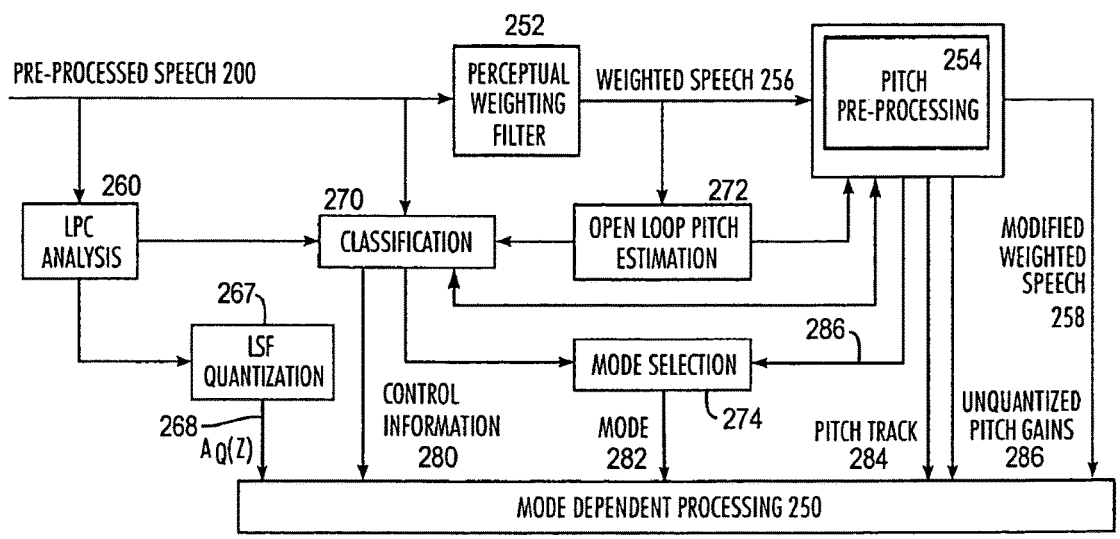
FIG. 4 is a functional block diagram illustrating an exemplary second stage of the source encoder used by one embodiment of the speech communication system of FIG. 1.
Figure 5:
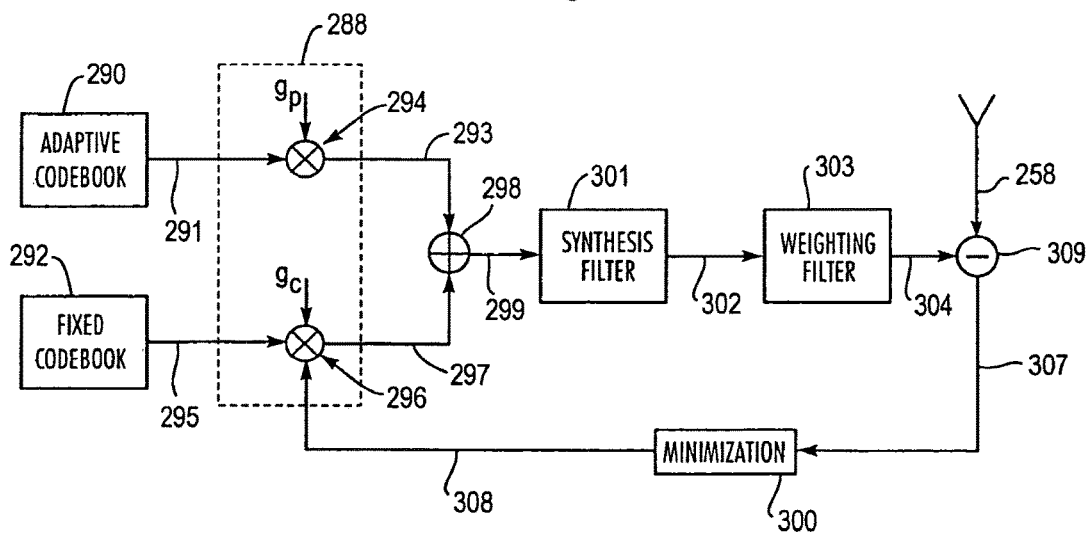
FIG. 5 is a functional block diagram illustrating an exemplary third stage of the source encoder used by one embodiment of the speech communication system of FIG. 1.
Figure 6:
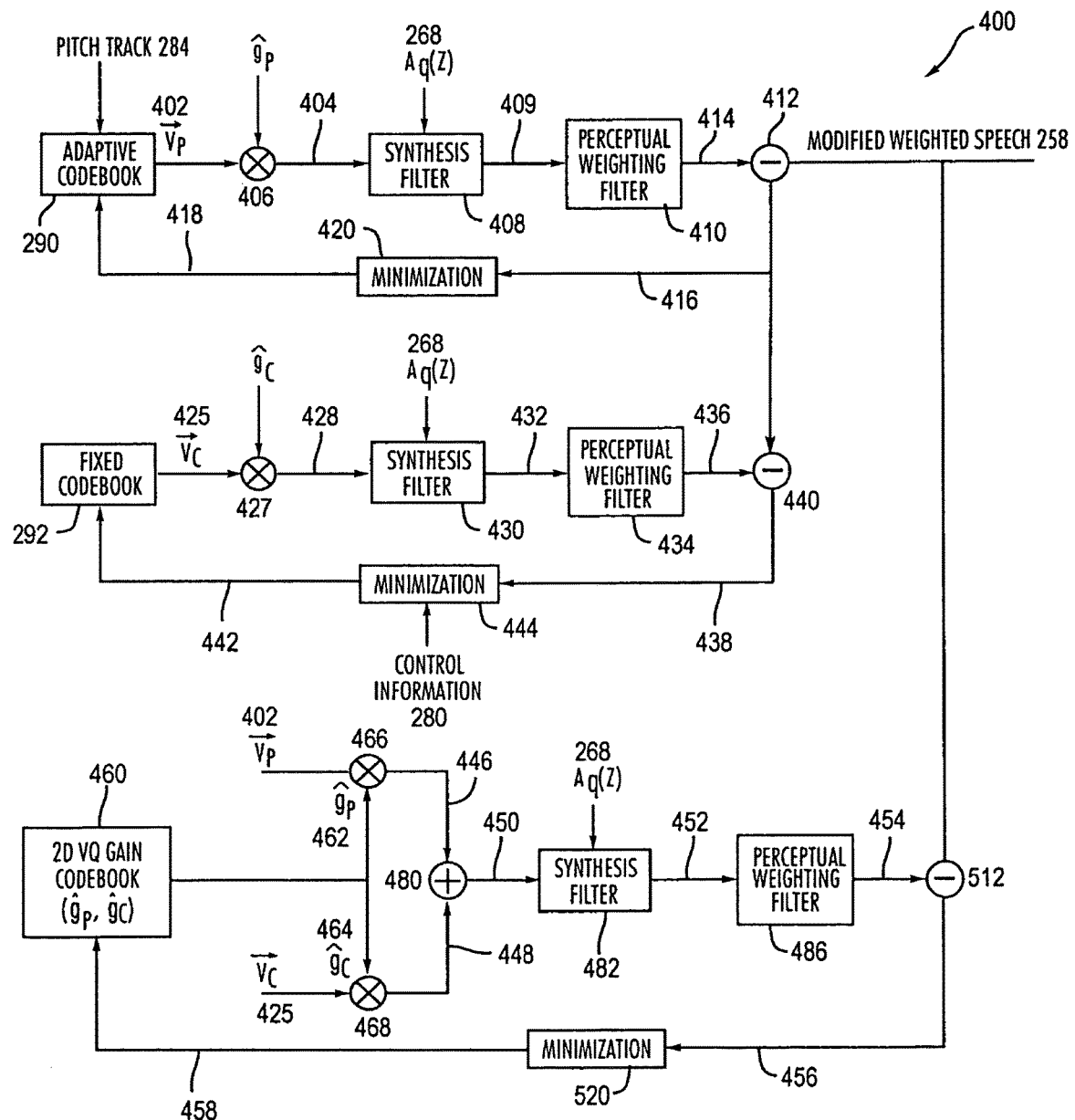
FIG. 6 is a functional block diagram illustrating an exemplary fourth stage of the source encoder used by one embodiment of the speech communication system of FIG. 1 for processing non-periodic speech (mode 0).
Figure 7:
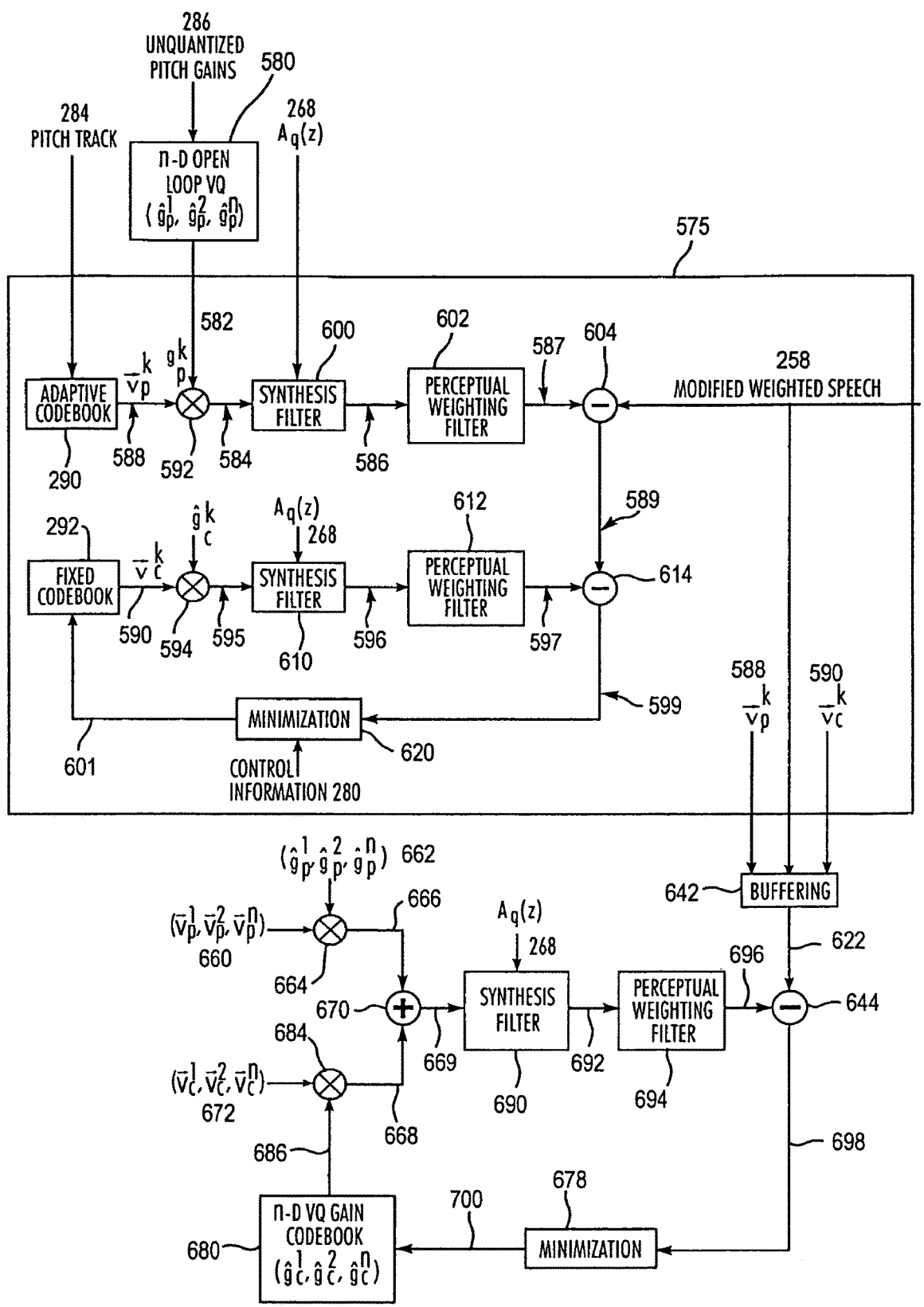
FIG. 7 is a functional block diagram illustrating an exemplary fourth stage of the source encoder used by one embodiment of the speech communication system of FIG. 1 for processing periodic speech (mode 1).

FIGS. 3-7 are functional block diagrams illustrating a multi-stage encoding approach used by one embodiment of the speech encoder illustrated in FIGS. 1 and 2. In particular, FIG. 3 is a functional block diagram illustrating a speech pre-processor 193 that comprises the first stage of the multi-stage encoding approach; FIG. 4 is a functional block diagram illustrating the second stage; FIGS. 5 and 6 are functional block diagrams depicting Mode 0 of the third stage; and FIG. 7 is a functional block diagram depicting Mode 1 of the third stage. The speech encoder, which comprises encoder processing circuitry, typically operates under software instruction to carry out the following functions.

Input speech is read and buffered into frames. Turning to the speech pre-processor 193 of FIG. 3, a frame of input speech 192 is provided to a silence enhancer 195 that determines whether the frame of speech is pure silence, i.e., only "silence noise" is present. The speech enhancer 195 adaptively detects on a frame basis whether the current frame is purely "silence noise." If the signal 192 is "silence noise," the speech enhancer 195 ramps the signal to the zero-level of the signal 192. Otherwise, if the signal 192 is not "silence noise," the speech enhancer 195 does not modify the signal 192. The speech enhancer 195 cleans up the silence portions of the clean speech for very low level noise and thus enhances the perceptual quality of the clean speech. The effect of the speech enhancement function becomes especially noticeable when the input speech originals from an A-law source; that is, the input has passed through A-law encoding and decoding immediately prior to processing by the present speech coding algorithm. Because A-law amplifies sample values around 0 (e.g., −1, 0, +1) to either −8 or +8, the amplification in A-law could transform an inaudible silence noise into a clearly audible noise. After processing by the speech enhancer 195, the speech signal is provided to a high-pass filter 197.

The high-pass filter 197 eliminates frequencies below a certain cutoff frequency and permits frequencies higher than the cutoff frequency to pass to a noise attenuator 199. In this particular embodiment, the high-pass filter 197 is identical to the input high-pass filter of the G.729 speech coding standard of ITU-T. Namely, it is a second order pole-zero filter with a cut-off frequency of 140 hertz (Hz). Of course, the high-pass filter 197 need not be such a filter and may be constructed to be any kind of appropriate filter known to those of ordinary skill in the art.

The noise attenuator 199 performs a noise suppression algorithm. In this particular embodiment, the noise attenuator 199 performs a weak noise attenuation of a maximum of 5 decibels (dB) of the environmental noise in order to improve the estimation of the parameters by the speech encoding algorithm. The specific methods of enhancing silence, building a high-pass filter 197 and attenuating noise may use any one of the numerous techniques known to those of ordinary skill in the art. The output of the speech pre-processor 193 is pre-processed speech 200.

Of course, the silence enhancer 195, high-pass filter 197 and noise attenuator 199 may be replaced by any other device or modified in a manner known to those of ordinary skill in the art and appropriate for the particular application.

Turning to FIG. 4, a functional block diagram of the common frame-based processing of a speech signal is provided. In other words, FIG. 4 illustrates the processing of a speech signal on a frame-by-frame basis. This frame processing occurs regardless of the mode (e.g., Modes 0 or 1) before the mode-dependent processing 250 is performed. The pre-processed speech 200 is received by a perceptual weighting filter 252 that operates to emphasize the valley areas and de-emphasize the peak areas of the pre-processed speech signal 200. The perceptual weighting filter 252 may be replaced by any other device or modified in a manner known to those of ordinary skill in the art and appropriate for the particular application.

A LPC analyzer 260 receives the pre-processed speech signal 200 and estimates the short term spectral envelope of the speech signal 200. The LPC analyzer 260 extracts LPC coefficients from the characteristics defining the speech signal 200. In one embodiment, three tenth-order LPC analyses are performed for each frame. They are centered at the middle third, the last third and the lookahead of the frame. The LPC analysis for the lookahead is recycled for the next frame as the LPC analysis centered at the first third of the frame. Thus, for each frame, four sets of LPC parameters are generated. The LPC analyzer 260 may also perform quantization of the LPC coefficients into, for example, a line spectral frequency (LSF) domain. The quantization of the LPC coefficients may be either scalar or vector quantization and may be performed in any appropriate domain in any manner known in the art.

A classifier 270 obtains information about the characteristics of the pre-processed speech 200 by looking at, for example, the absolute maximum of frame, reflection coefficients, prediction error, LSF vector from the LPC analyzer 260, the tenth order autocorrelation, recent pitch lag and recent pitch gains. These parameters are known to those of ordinary skill in the art and for that reason, are not further explained here. The classifier 270 uses the information to control other aspects of the encoder such as the estimation of signal-to-noise ratio, pitch estimation, classification, spectral smoothing, energy smoothing and gain normalization. Again, these aspects are known to those of ordinary skill in the art and for that reason, are not further explained here. A brief summary of the classification algorithm is provided next.

The classifier 270, with help from the pitch preprocessor 254, classifies each frame into one of six classes according to the dominating feature of the frame. The classes are (1) Silence/background Noise; (2) Noise/Like Unvoiced Speech; (3) Unvoiced; (4) Transition (includes onset); (5) Non-Stationary Voiced; and (6) Stationary Voiced. The classifier 270 may use any approach to classify the input signal into periodic signals and non-periodic signals. For example, the classifier 270 may take the pre-processed speech signal, the pitch lag and correlation of the second half of the frame, and other information as input parameters.

Various criteria can be used to determine whether speech is deemed to be periodic. For example, speech may be considered periodic if the speech is a stationary voiced signal. Some people may consider periodic speech to include stationary voiced speech and non-stationary voiced speech, but for purposes of this specification, periodic speech includes stationary voiced speech. Furthermore, periodic speech may be smooth and stationary speech. A voice speech is considered to be "stationary" when the speech signal does not change more than a certain amount within a frame. Such a speech signal is more likely to have a well defined energy contour. A speech signal is "smooth" if the adaptive codebook gain $G_P$ of that speech is greater than a threshold value. For example, if the threshold value is 0.7, a speech signal in a subframe is considered to be smooth if its adaptive codebook gain $G_P$ is greater than 0.7. Non-periodic speech, or non-voiced speech, includes unvoiced speech (e.g., fricatives such as the "shhh" sound), transitions (e.g., onsets, offsets), background noise and silence.

More specifically, in the example embodiment, the speech encoder initially derives the following parameters:

Spectral Tilt (estimation of first reflection coefficient 4 times per frame):

$$\kappa(k) = \frac{\sum_{n=1}^{L-1} s_k(n) \cdot s_k(n-1)}{\sum_{n=0}^{L-1} s_k(n)^2} \quad k = 0, 1, \ldots, 3, \quad (1)$$

where L=80 is the window over which the reflection coefficient is calculated and $S_k(n)$ is the $k^{th}$ segment given by $$S_k(n) = s(k \cdot 40 - 20 + n) \cdot w_h(n), \; n = 0, 1, \ldots 79, \quad (2)$$

where $w_h(n)$ is a 80 sample Hamming window and s(0), s(1), ..., s(159) is the current frame of the pre-processed speech signal.

Absolute Maximum (tracking of absolute signal maximum, 8 estimates per frame):

$$\chi(k) = \max\{|s(n)|, n = n_s(k), n_s(k)+1, \ldots, n_e(k)-1\}, \; k = 0, 1, \ldots, 7 \quad (3)$$

where $n_s(k)$ and $n_e(k)$ is the starting point and end point, respectively, for the search of the $k^{th}$ maximum at time $k \cdot 160/8$ samples of the frame. In general, the length of the segment is 1.5 times the pitch period and the segments overlap. Thus, a smooth contour of the amplitude envelope can be obtained.

The Spectral Tilt, Absolute Maximum, and Pitch Correlation parameters form the basis for the classification. However, additional processing and analysis of the parameters are performed prior to the classification decision. The parameter processing initially applies weighting to the three parameters. The weighting in some sense removes the background noise component in the parameters by subtracting the contribution from the background noise. This provides a parameter space that is "independent" from any background noise and thus is more uniform and improves the robustness of the classification to background noise.

Running means of the pitch period energy of the noise, the spectral tilt of the noise, the absolute maximum of the noise, and the pitch correlation of the noise are updated eight times per frame according to the following equations, Equations 4-7. The following parameters defined by Equations 4-7 are estimated/sampled eight times per frame, providing a fine time resolution of the parameter space:

Running mean of the pitch period energy of the noise:

$$<E_{N,P}(k)> = \alpha_1 \cdot <E_{N,P}(k-1)> + (1-\alpha_1) \cdot E_p(k), \quad (4)$$

where $E_{N,P}(k)$ is the normalized energy of the pitch period at time $k \cdot 160/8$ samples of the frame. The segments over which the energy is calculated may overlap since the pitch period typically exceeds 20 samples (160 samples/8).

Running means of the spectral tilt of the noise:

$$<\kappa_N(k)> = \alpha_1 \cdot <\kappa_N(k-1)> + (1-\alpha_1) \cdot \kappa(k \bmod 2). \quad (5)$$

Running mean of the absolute maximum of the noise:

$$<\chi_N(k)> = \alpha_1 \cdot <X_N(k-1)> + (1-\alpha_1) \cdot \chi(k). \quad (6)$$

Running mean of the pitch correlation of the noise:

$$<R_{N,P}(k)> = \alpha_1 \cdot <R_{N,P}(k-1)> + (1-\alpha_1) \cdot R_p, \quad (7)$$

where $R_p$ is the input pitch correlation for the second half of the frame. The adaptation constant $\alpha_1$ is adaptive, though the typical value is $\alpha_1 = 0.99$.

The background noise to signal ratio is calculated according to $$\gamma(k) = \sqrt{\frac{<E_{N,P}(k)>}{E_p(k)}}. \quad (8)$$

The parametric noise attenuation is limited to 30 dB, i.e., $$\gamma(k) = \{\gamma(k) > 0.968 ? 0.968 : \gamma(k)\} \quad (9)$$

The noise free set of parameters (weighted parameters) is obtained by removing the noise component according to the following Equations 10-12:

Estimation of weighted spectral tilt:

$$\kappa_w(k) = \kappa(k \bmod 2) - \gamma(k) \cdot <\kappa_N(k)>. \quad (10)$$

Estimation of weighted absolute maximum:

$$\chi_w(k) = \chi(k) - \gamma(k) \cdot <\chi_N(k)>. \quad (11)$$

Estimation of weighted pitch correlation:

$$R_{w,p}(k) = R_p - \gamma(k) \cdot <R_{N,p}(k)>. \quad (12)$$

The evolution of the weighted tilt and the weighted maximum is calculated according to the following Equations 13 and 14, respectively, as the slope of the first order approximation:

$$\partial \kappa_w(k) = \frac{\sum_{l=1}^{7} l \cdot (\chi_w(k-7+l) - \chi_w(k-7))}{\sum_{l=1}^{7} l^2} \quad (13)$$

$$\partial \kappa_w(k) = \frac{\sum_{l=1}^{7} l \cdot (\kappa_w(k-7+l) - \kappa_w(k-7))}{\sum_{l=1}^{7} l^2} \quad (14)$$

Once the parameters of Equations 4 through 14 are updated for the eight sample points of the frame, the following frame-based parameters are calculated from the parameters of Equations 4-14:

Maximum weighted pitch correlation:

$$R_{w,p}^{max} = \max\{R_{w,p}(k-7+l), l=0, 1, \ldots, 7\} \quad (15)$$

Average weighted pitch correlation:

$$R_{w,p}^{avg} = \frac{1}{8}\sum_{l=0}^{7} R_{w,p}(k-7+l). \quad (16)$$

Running mean of average weighted pitch correlation:

$$<R_{w,p}^{avg}(m)> = \alpha_2 \cdot <R_{w,p}^{avg}(m-1)> + (1-\alpha_2) \cdot R_{w,p}^{avg}, \quad (17)$$

where m is the frame number and $\alpha_2 = 0.75$ is the adaptation constant.

Normalized standard deviation of pitch lag:

$$\sigma_{L_p}(m) = \frac{1}{\mu_{L_p}(m)} \sqrt{\frac{\sum_{l=0}^{2} (L_p(m-2+l) - \mu_{L_p}(m))^2}{3}}, \quad (18)$$

where $L_p(m)$ is the input pitch lag and $\mu_{L_p}(m)$ is the mean of the pitch lag over the past three frames given by $$\mu_{L_p}(m) = \frac{1}{3} \sum_{l=0}^{2} (L_p(m-2+l)). \quad (19)$$

Minimum weighted spectral tilt:

$$K_n^{min} = \min\{\kappa_w(k-7+l), l=0, 1, \ldots, 7\} \quad (20)$$

Running mean of minimum weighted spectral tilt:

$$<\kappa_w^{min}(m)> = \alpha_2 \cdot <\kappa_w^{min}(m-1)> + (1-\alpha_2) \cdot \kappa_w^{min}. \quad (21)$$

Average weighted spectral tilt:

$$\kappa_w^{avg} = \frac{1}{8} \sum_{l=0}^{7} \kappa_w(k-7+l). \quad (22)$$

Minimum slope of weighted tilt:

$$\partial \kappa_w^{min} = \min\{\partial \kappa_w(k-7+l), l=0, 1, \ldots, 7. \quad (23)$$

Accumulated slope of weighted spectral tilt:

$$\partial \kappa_w^{acc} = \sum_{l=0}^{7} \partial \kappa_w(k-7+l). \quad (24)$$

Maximum slope of weighted maximum:

$$\partial_{\chi_w}^{max} = \max\{\partial_{\chi_w}(k-7+l), l=0, 1, \ldots, 7 \quad (25)$$

Accumulated slope of weighted maximum:

$$\partial \chi_w^{acc} = \sum_{l=0}^{7} \partial \chi_w(k-7+l). \quad (26)$$

The parameters given by Equations 23, 25, and 26 are used to mark whether a frame is likely to contain an onset, and the parameters given by Equations 16-18, 20-22 are used to mark whether a frame is likely to be dominated by voiced speech. Based on the initial marks, past marks and other information, the frame is classified into one of the six classes.

A more detailed description of the manner in which the classifier 270 classifies the pre-processed speech 200 is described in a U.S. patent application assigned to the same assignee, Conexant Systems, Inc., and previously incorporated herein by reference: Provisional U.S. Patent Application Ser. No. 60/155,321 titled "4 kbits/s Speech Coding," filed Sep. 22, 1999.

The LSF quantizer 267 receives the LPC coefficients from the LPC analyzer 260 and quantizes the LPC coefficients. The purpose of LSF quantization, which may be any known method of quantization including scalar or vector quantization, is to represent the coefficients with fewer bits. In this particular embodiment, LSF quantizer 267 quantizes the tenth order LPC model. The LSF quantizer 267 may also smooth out the LSFs in order to reduce undesired fluctuations in the spectral envelope of the LPC synthesis filter. The LSF quantizer 267 sends the quantized coefficients $A_q(z)$ 268 to the subframe processing portion 250 of the speech encoder. The subframe processing portion of the speech encoder is mode dependent. Though LSF is preferred, the quantizer 267 can quantize the LPC coefficients into a domain other than the LSF domain.

If pitch pre-processing is selected, the weighted speech signal 256 is sent to the pitch preprocessor 254. The pitch preprocessor 254 cooperates with the open loop pitch estimator 272 in order to modify the weighted speech 256 so that its pitch information can be more accurately quantized. The pitch preprocessor 254 may, for example, use known compression or dilation techniques on pitch cycles in order to improve the speech encoder's ability to quantize the pitch gains. In other words, the pitch preprocessor 254 modifies the weighted speech signal 256 in order to match better the estimated pitch track and thus more accurately fit the coding model while producing perceptually indistinguishable reproduced speech. If the encoder processing circuitry selects a pitch pre-processing mode, the pitch preprocessor 254 performs pitch pre-processing of the weighted speech signal 256. The pitch preprocessor 254 warps the weighted speech signal 256 to match interpolated pitch values that will be generated by the decoder processing circuitry. When pitch pre-processing is applied, the warped speech signal is referred to as a modified weighted speech signal 258. If pitch pre-processing mode is not selected, the weighted speech signal 256 passes through the pitch pre-processor 254 without pitch pre-processing (and for convenience, is still referred to as the "modified weighted speech signal" 258). The pitch preprocessor 254 may include a waveform interpolator whose function and implementation are known to those of ordinary skill in the art. The waveform interpolator may modify certain irregular transition segments using known forward-backward waveform interpolation techniques in order to enhance the regularities and suppress the irregularities of the speech signal. The pitch gain and pitch correlation for the weighted signal 256 are estimated by the pitch preprocessor 254. The open loop pitch estimator 272 extracts information about the pitch characteristics from the weighted speech 256. The pitch information includes pitch lag and pitch gain information.

The pitch preprocessor 254 also interacts with the classifier 270 through the open-loop pitch estimator 272 to refine the classification by the classifier 270 of the speech signal. Because the pitch preprocessor 254 obtains additional information about the speech signal, the additional information can be used by the classifier 270 in order to fine tune its classification of the speech signal. After performing pitch pre-processing, the pitch preprocessor 254 outputs pitch track information 284 and unquantized pitch gains 286 to the mode-dependent subframe processing portion 250 of the speech encoder.

Once the classifier 270 classifies the pre-processed speech 200 into one of a plurality of possible classes, the classification number of the pre-processed speech signal 200 is sent to the mode selector 274 and to the mode-dependent subframe processor 250 as control information 280. The mode selector 274 uses the classification number to select the mode of operation. In this particular embodiment, the classifier 270 classifies the pre-processed speech signal 200 into one of six possible classes. If the pre-processed speech signal 200 is stationary voiced speech (e.g., referred to as "periodic" speech), the mode selector 274 sets mode 282 to Mode 1. Otherwise, mode selector 274 sets mode 282 to Mode 0. The mode signal 282 is sent to the mode dependent subframe processing portion 250 of the speech encoder. The mode information 282 is added to the bitstream that is transmitted to the decoder.

The labeling of the speech as "periodic" and "non-periodic" should be interpreted with some care in this particular embodiment. For example, the frames encoded using Mode 1 are those maintaining a high pitch correlation and high pitch gain throughout the frame based on the pitch track 284 derived from only seven bits per frame. Consequently, the selection of Mode 0 rather than Mode 1 could be due to an inaccurate representation of the pitch track 284 with only seven bits and not necessarily due to the absence of periodicity. Hence, signals encoded using Mode 0 may very well contain periodicity, though not well represented by only seven bits per frame for the pitch track. Therefore, the Mode 0 encodes the pitch track with seven bits twice per frame for a total of fourteen bits per frame in order to represent the pitch track more properly.

Each of the functional blocks on FIGS. 3-4, and the other FIGs in this specification, need not be discrete structures and may be combined with another one or more functional blocks as desired.

The mode-dependent subframe processing portion 250 of the speech encoder operates in two modes of Mode 0 and Mode 1. FIGS. 5-6 provide functional block diagrams of the Mode 0 subframe processing while FIG. 7 illustrates the functional block diagram of the Mode 1 subframe processing of the third stage of the speech encoder.

Turning to FIG. 5, a selected excitation vector 291 from the adaptive codebook 290 is sent to a multiplier 294 where it is multiplied with the quantized pitch gain $G_P$ to produce a gain scaled adaptive codebook contribution 293. Similarly, a selected excitation vector 295 from the fixed codebook 292 is sent to a multiplier 296 where it is multiplied with the quantized fixed codebook gain $G_C$ to produce a gain scaled fixed codebook contribution 297. The gain scaled adaptive codebook contribution 293 and the gain scaled fixed codebook contribution 297 are added by adder 298 to produce added signal 299. Added signal 299 is processed by the synthesis filter 301 which performs a function that is the inverse of a quantized LPC analysis. The weighting filter 303 likewise performs a function that is the inverse of the perceptual weighting filter 252. In other words, the synthesis filter 301 and the weighting filter 303 act to re-synthesize a speech signal 304 from the added signal 299. By using the added signal 299 which was derived from quantized information, the synthesis filter 301 and the weighting filter 303 attempt to create a replica of the speech signal, e.g., resynthesized speech signal 304. Ideally, the resynthesized speech signal 304 would be exactly the same as the target signal (e.g., modified weighted signal 258). However, because of the effects of quantization, the resynthesized speech signal 304 is not exactly the same as the target modified weighted signal 258. In order to minimize the error in the quantization of the adaptive codebook gain $G_P$ and the fixed codebook gain $G_C$, the Mode 0 subframe processor of FIG. 5 determines the error by subtracting the resynthesized speech signal 304 from the modified weighted signal 258. Essentially, subtractor 309 subtracts the resynthesized speech signal 304 from the modified weighted signal 258 to generate an energy signal 307. The minimizer 300 receives the signal 307 which represents the error in the quantization of the pitch contribution. Based on the signal 307, the minimizer 300 controls the selection of excitation vectors from the adaptive codebook 290 and the fixed codebook 292 so as to reduce the error. The process repeats until the minimizer 300 has selected the best excitation vectors from the adaptive codebook 290 and the fixed codebook 292 which minimize the error in the resynthesized speech signal 304 for each subframe. Of course, the synthesis filter 301, weighting filter 303 and minimizer 300 may be replaced by any other device or modified in a manner known to those of ordinary skill in the art and appropriate for the particular application.

As shown in the box 288 formed by the dotted line in FIG. 5, the adaptive and fixed codebook gains are jointly vector quantized. In this particular example embodiment, the adaptive and fixed codebook gains are jointly vector quantized with seven bits per subframe in accordance with the method specified in G.729. The two-dimensional codebook used to jointly quantize the adaptive and fixed codebook gains is searched exhaustively for the entry that minimizes the mean-squared error between the target speech signal 258 and the reconstructed speech signal 304, i.e., minimizing $$E = \sum_{n=0}^{79} (t(n) - (\hat{g}_p v_p(n) * h(n) + \hat{g}_c v_c(n) * h(n)))^2, \quad (27)$$

where the quantized adaptive and fixed codebook gains are derived from the seven bit codebook. Rather than have the codebook contain the adaptive codebook gain and the fixed codebook gain, the codebook may contain the adaptive codebook gain and the correction factor for the predicted fixed codebook gain (which represents the fixed codebook gain). The prediction of the fixed codebook gain is based on a second order moving average prediction of the fixed codebook energy. The relation between the correction factor $\gamma_k$ and the quantized fixed codebook gain is given by $\hat{g}_c = \gamma_k \cdot \tilde{g}_c$, where $\hat{g}_c$ is the quantized fixed codebook gain and $\tilde{g}_c$ is the predicted fixed codebook gain. The predicted fixed codebook gain is given by:

$$\tilde{g}_c = 10^{\frac{1}{20}(\tilde{E}_k - E_c + \bar{E})}, \quad \text{where } \bar{E} = 30 \text{ dB is the mean energy,} \quad (28)$$

$$E_c = 10\log_{10}\left(\frac{1}{80}\sum_{n=0}^{79} v_c(n)^2\right), \quad (29)$$

and $$\tilde{E}_k = \sum_{i=1}^{2} b_i \cdot (20\log_{10}\gamma_{k-i}). \quad (30)$$

The prediction coefficients of the moving average prediction are $\{b_1 b_2\} = \{0.6, 0.3\}$. The Mode 0 manner of processing subframes is known by those of ordinary skill in the art and may be modified as appropriate and in a manner known in the art.

FIG. 6 illustrates a more detailed block diagram of the Mode 0 subframe processor of FIG. 5. Three distinct steps occur in FIG. 6. The first step is to select the best excitation vector $V_P$ from the adaptive codebook 290 by an analysis-by-synthesis approach. The pitch track information 284 from the pitch preprocessor 254 is used to select an initial excitation vector from the adaptive codebook 290. The multiplier 406 multiplies the excitation vector 402 by the quantized adaptive codebook gain $G_P$ from the gain codebook 460 and passes a multiplied signal 404 to a synthesis filter 408. The synthesis filter 408 receives the quantized LPC coefficients $A_q(z)$ 268 from the LSF quantizer 267 and together with the perceptual weighting filter 410, creates a resynthesized speech signal 414. The subtractor 412 subtracts the resynthesized speech signal 414 from the target modified weighted signal 258 to generate a signal 416. The minimizer 420 receives the signal 416 which represents the error in quantizing the adaptive codebook gain. The minimizer 420 controls the selection of the excitation vector from the adaptive codebook 290 in order to reduce the error. The process repeats until the minimizer 420 has selected the best excitation vector from the adaptive codebook 290 for each subframe which minimizes the error in the resynthesized speech signal 414. After selecting the best pitch contribution from the adaptive codebook 290, the residual signal 416 is the modified weighted speech signal 258 less the pitch contribution. This residual signal 416 is used in the second step of selecting the best excitation vector from the fixed codebook 292 which minimizes the error in the resynthesized speech signal 436.

A more detailed description of this second step is now provided. An excitation vector is selected from the fixed codebook 292. The multiplier 427 multiplies the excitation vector 425 by the quantized fixed codebook gain $G_C$ from the gain codebook 460 and passes a multiplied signal 428 to a synthesis filter 430. The synthesis filter 430 receives the quantized LPC coefficients $A_q(z)$ 268 from the LSF quantizer 267 and together with the perceptual weighting filter 434, creates a resynthesized speech signal 436. The subtractor 440 subtracts the resynthesized speech signal 436 from the target signal (e.g., signal 416) to generate a second residual signal 438. The minimizer 444 receives the signal 438 which represents the error in quantizing the fixed codebook gain. The minimizer 444 uses the signal 438 to control the selection of excitation vectors from the fixed codebook 292 in order to reduce the error. The minimizer 444 receives control information 280 (which includes the classification number of the speech signal) and depending on the classification, alters how it controls the selection of excitation vectors from the fixed codebook 292. The process repeats until the minimizer 444 has selected the best excitation vector from the fixed codebook 292 for each subframe which minimizes the error in the resynthesized speech signal 436. Because we are assuming mode 0 operation at this point, the Mode 0 subframe processor has found the best excitation vectors from both the adaptive codebook 290 and the fixed codebook 292.

The third step performed by the Mode 0 subframe processor of FIG. 6 is now described. At this point, the best excitation vectors for the adaptive and fixed codebooks have been found. Their respective gains are jointly vector quantized. Gain codebook vectors representing the joint vector quantization of the adaptive codebook gain and the fixed codebook gain are selected from the two-dimensional vector quantization gain codebook 460 and passed to multipliers 266, 268. The multiplier 466 multiplies the quantized adaptive codebook gain $G_P$ 462 with the best excitation vector $V_P$ 402 from the adaptive codebook to form signal 446. The multiplier 468 multiplies the quantized fixed codebook gain $G_C$ 464 with the best excitation vector $V_C$ 425 from the fixed codebook to form signal 448. Note that the selected excitation vectors $V_P$ 402 and $V_C$ 425 have been found as being the best excitation values during the first and second steps of the Mode 0 subframe processing. The adder 480 adds signals 446 and 448 to form added signal 450. Added signal 450 is resynthesized by the combination of the synthesis filter 482 and the perceptual weighting filter 486 to form a resynthesized speech signal 454. As with the synthesis filters 408 and 430, the synthesis filter 482 receives LPC coefficients $A_q(z)$ 268. The subtractor 512 subtracts the resynthesized speech signal 454 from the target modified weighted speech signal 258 to generate a third residual signal 456. The minimizer 520 receives the third signal 456 which represents the error resulting from the joint quantization of the fixed codebook gain and the adaptive codebook gain by the two-dimensional vector quantization gain codebook 460. The minimizer 520 uses the signal 456 to control the selection of excitation vectors from the two-dimensional vector quantization gain codebook 460 in order to reduce the error. The process repeats until the minimizer 520 has selected the best excitation vector from the two-dimensional vector quantization gain codebook 460 for each subframe which minimizes the error in the resynthesized speech signal 454. Once the error has been minimized, the quantized gains $G_P$ and $G_C$ from the two-dimensional vector quantization gain codebook 460 is used by multipliers 294, 296 in FIG. 5.

Again, the synthesis filters 408, 430 and 482, weighting filters 410, 434 and 486, minimizers 420, 430 and 520, multipliers 406, 427 and 468, adder 480, and subtractors 412, 440 and 512 (as well as any other filter, minimizer, multiplier, adder and subtractor described in this application) may be replaced by any other device or modified in a manner known to those of ordinary skill in the art and appropriate for the particular application.

Now that Mode 0 subframe processing has been described in detail, the Mode 1 subframe processing will be discussed. FIG. 7 illustrates a functional block diagram of the Mode 1 subframe processor portion of the mode dependent subframe processor 250. The pitch track 284 selects an adaptive codebook gain vector 588 from the adaptive codebook 290. The adaptive codebook contribution is based on the past excitation and the pitch track 284 from the pitch pre-processor 254 and no search through the codebook 290 is required. According to the interpolated pitch track $L_p(n)$ from the pitch pre-processor 254, each sample value of the adaptive codebook excitation is obtained by interpolation of the past excitation using a 21 st order Hamming weighted Sinc window:

$$v_p(n) = \sum_{i=10}^{10} w_s(f(L_p(n)), i) \cdot e(n-i)(L_p(n)), \qquad (31)$$

where e(n) is the past excitation, $i(L_p(n))$ and $f(L_p(n))$ is the integer and fractional part of the pitch lag, respectively, and $w_s(f,i)$ is the Hamming weighted Sinc window. The optimal weighted mean square error in the pitch gain is estimated according to:

$$g = \frac{\sum_{n=0}^{N-1} t(n) \cdot (v_p(n) * h(n))}{\sum_{n=0}^{N-1} (v_p(n) * h(n))^2}, \quad \text{bounded by } 0.0 \leq g \leq 1.2 \qquad (32)$$

in order to minimize the weighted mean square error between the original and reconstructed speech. "N" in Equation 32 is the variable number of the subframes per frame. The unquantized pitch gain is calculated according to the following weighting of the optimal pitch gain $$g_P = \left(\frac{1}{2}R_n + \frac{1}{2}\right) \cdot g, \tag{33}$$

where the normalized cross-correlation is given by $$R_n = \frac{\sum_{n=0}^{N-1} t(n) \cdot (v_p(n) * h(n))}{\sqrt{\left(\sum_{n=0}^{N-1} t(n)^2\right) \cdot \left(\sum_{n=0}^{N-1} (v_p(n) * h(n))^2\right)}}. \tag{34}$$

This weighting de-emphasizes the pitch contribution from the adaptive codebook prior to the fixed codebook search, leaving more of the pitch information in the target signal for the fixed codebook search.

The unquantized pitch gains 286 from the frame-based processing portion of the speech encoder is provided to an n-dimensional pre-vector quantizer 580. If, for example, each frame is divided into three subframes, the n-dimensional vector quantizer 580 would be a three-dimensional vector quantizer which outputs a vector quantized pitch gain 582 to a multiplier 592. The multiplier 592 multiplies the adaptive codebook gain vector 588 with the quantized pitch gain vector 582 and sends the result 584 to a synthesis filter 600. The synthesis filter 600 also receives the quantized LPC coefficients $A_q(z)$ 268 from the LSF quantizer 267 and sends its output 586 to a perceptual weighting filter 602. The synthesis filter 600 and the perceptual weighting filter 602 together create a resynthesized speech signal 587 which is subtracted from the modified weighted speech signal 258 by a subtractor 604. The difference signal 589 is then sent to another subtractor 614.

A fixed codebook 292 sends a fixed codebook gain vector 590 to a multiplier 594. The multiplier 594 multiplies the fixed codebook gain vector 590 with a computed fixed codebook gain vector $g_c^k$. The multiplied signal 595 is sent to a synthesis filter 610. The synthesis filter 610 also receives the quantized LPC coefficients $A_q(z)$ 268 and sends its output 596 to a perceptual weighting filter 612. Together, the synthesis filter 610 and the perceptual weighting filter 612 create a resynthesized speech signal 597 which is subtracted from the difference signal 589 by the subtractor 614 to generate another difference signal 599. The difference signal 589 represents the error in quantizing the adaptive codebook gain and the difference signal 599 represents the error in quantizing the fixed code bookgain. The difference signal 599 is received by a minimizer 620 which then controls the selection of the excitation vector from the fixed codebook 292 in order to reduce the error. The minimizer also receives control information 280 from the frame-based processing portion of the speech encoder, namely, the classification number of the frame. More specifically, in this example embodiment, the fixed codebook 292 has three sub pulse codebooks: a 2-pulse codebook, a 3-pulse codebook and a 6-pulse codebook. The initial target for the fixed codebook 292 is calculated from the weighted pre-processed speech 258 with the zero-response removed, i.e., the target for the adaptive codebook 290, and the optimal adaptive codebook excitation and gain according to $$t'(n) = t(n) - g_p \cdot (v_p(n) * h(n)). \tag{35}$$

The selection of the final fixed codebook excitation involves comparing the weighted mean squared error 599 of the best candidate from each of the sub-codebooks in the fixed codebook 292 after applying appropriate weighting according to the classification 280. The final fixed codebook excitation is denoted $\bar{v}_c$ or $v_c(n)$.

The fixed codebook gain vector selection process repeats until the minimizer 620 has selected the best excitation vector from the fixed codebook 292 for each subframe which minimizes the error in the resynthesized speech signal 597. After selecting the best excitation vector from the fixed codebook 292, the selected adaptive codebook gain vector 588 and the selected fixed codebook gain vector 590 are sent along with the modified weighted speech signal 258 to a buffer 642.

In Mode 1, the frame is divided into n subframes, where in this particular example embodiment, n is 3. The processing performed within box 575 is executed on a subframe basis where the index k denotes the subframe number. The remaining functions outside box 575 are executed on a frame basis. As a result of mixing subframe and frame-based processing, certain functions cannot be completed until other functions are finished. Consequently, certain parameters for the n (e.g., three) subframes must be stored in a buffer 642 at the boundary between subframe and frame-based processing. The buffered parameters may include, for example, the prequantized pitch gains, quantized adaptive and fixed code book vectors, the target vector and other parameters. The buffered information is then sent to a subtractor 644.

The n adaptive codebook gain vectors 660 are multiplied with the n pitch gain vectors 662 by a multiplier 664 to generate a multiplied signal 666. The multiplied signal 666 is then sent to an adder 670. An n-dimensional vector quantizer gain codebook 680 provides quantized fixed codebook gain vectors to be multiplied with a fixed codebook gain vector 672 by a multiplier 684. The multiplied signal 668 is sent to the adder 670. The adder 670 sends the additive signal 669 to a synthesis filter 690. The synthesis filter 690 receives the quantized LPC coefficients $A_q(z)$ 268. The synthesis filter 690 and the perceptual weighting filter 694 act together to create a resynthesized speech signal 696. The resynthesized speech signal 696 is subtracted from the modified weighted speech signal 258 by the subtractor 644. The difference signal 698 which represents the error in quantizing the fixed codebook gain vectors is sent to a minimizer 678. The minimizer 678 selects another fixed codebook gain vector from the n-dimensional vector quantizer 680 in order to minimize this error.

Specifically, in this example embodiment, the three pitch gains derived during the pitch pre-processing are pre-vector quantized with a four bit 3-dimensional vector quantizer according to $$\{\hat{g}_p^1, \hat{g}_p^2 \hat{g}_p^3\} = \arg \tag{36}$$

$$\min\left\{\left(\sum_{l=1}^{3}(g_p^l - \hat{g}_p^l)^2\right) \cdot \{\hat{g}_p^1, \hat{g}_p^2, \hat{g}_p^3\} \in \left\{\begin{array}{c}\{\hat{g}_p^{l,1}, \hat{g}_p^{l,2}, \hat{g}_p^{l,3}\} \\ l = 0, 1, \ldots, 15\end{array}\right\}\right\}.$$

This pre-vector quantization of the pitch gains takes place before the closed loop subframe processing begins. The subframe processing of Mode 1 is performed with unquantized fixed codebook gains. The excitation gain vectors 588 and 590 and the target signals are buffered in buffer 642 during the subframe processing and used to perform delayed joint quantization of the three fixed codebook gains with an eight bit vector quantizer 680. The best codebook gain vectors $\bar{v}_p$, $\bar{v}_c$ for each subframe are saved in the buffer 642.

In order to fully synchronize the speech encoder and decoder as well as update the filter memories of filters 600, 610 correctly, the synthesis for all subframes are repeated with fully quantized parameters once the delayed vector quantization of the three fixed codebook gains is complete.

The n-dimensional codebook 680 (here, n=3) is searched in order to minimize $$E = \sum_{n=0}^{L1-1} \left(t^1(n) - (\hat{g}_p^1 v_p^1(n) * h(n) + \hat{g}_c^1 v_c^1(n) * h(n))\right)^2 + \qquad (37)$$

$$\sum_{n=0}^{L2-1} \left(t^2(n) - (\hat{g}_p^2 v_p^2(n) * h(n) + \hat{g}_c^2 v_c^2(n) * h(n))\right)^2 +$$

$$\sum_{n=0}^{L3-1} \left(t^3(n) - g_p^3 v_p^3(n) * h(n) + \hat{g}_c^3 v_c^3(n) * h(n)\right)^2$$

where L1, L2, and L3 are the lengths of each subframe in Mode 1. The quantized pitch gains $\{\hat{g}_c^1, \hat{g}_c^2, \hat{g}_c^3\}$ originate from the original frame based processing and $\{t^1(n), t^2(n), t^3(n)\}$, $\{v_a^1(n), v_a^2(n), v_a^3(n)\}$, and $\{v_c^1(n), v_c^2(n), v_c^3(n)\}$ are buffered during the subframe processing, where the superscripts represent the 1$^{st}$, 2$^{nd}$ and 3$^{rd}$ subframe (and are not exponents).

The best fixed codebook gains $\{\hat{g}_c^1, \hat{g}_c^2, \hat{g}_c^3\}$ are selected from an eight bit codebook 680 where the entries of the codebook contain a 3-dimensional correction factor for the predicted fixed codebook gains. The prediction of the fixed codebook gains is based on a moving average prediction of the fixed codebook energy.

The relation between the correction factors $\gamma_k^j$ and the quantized fixed codebook gains is given by:

$$\hat{g}_c^j = \gamma_k^j \cdot \tilde{g}_c^j \qquad (38)$$

where $\hat{g}_c^j$ is the quantized fixed codebook gain and $\tilde{g}_c^j$ is the predicted fixed codebook gain of the jth subframe of frame k.

The predicted fixed codebook gains is based on moving average prediction of the fixed codebook energy given by:

$$\tilde{g}_c^j = 10^{\frac{1}{20}(\tilde{E}_k^j + \bar{E}_c^j - \bar{E})} \qquad (39)$$

where the $\bar{E}$=34 dB is the mean energy, and $$E_c^j = 10\log_{10}\left(\frac{1}{N}\sum_{n=0}^{N-1} v_c^j(n)^2\right), \qquad (40)$$

and $$\tilde{E}_k^j = \sum_{i=j}^{3} b_i \cdot \left(20\log_{10}\gamma_{k-1}^{j-i}\right)k \qquad (41)$$

The prediction coefficients for the moving average prediction are $\{b_1, b_2, b_3\} = \{0.6, 0.3, 0.1\}$. The prediction of the energy from further back has greater leakage in order to accommodate the greater uncertainty associated with the prediction. This applies to the second and third subframe where the most recent history is not yet available due to the joint quantization. Other types of predictions are possible where they may use different prediction coefficients for each subframe.

A special feature incorporated in the search for excitation vectors in the fixed codebook is that the selected fixed codebook excitation vector is filtered through an adaptive pre-filter P(z) that enhances the harmonic components to improve the quality of the reconstructed speech. The filter, for example, may perform the following function:

$$P(z)=1/(1-\beta z^{-T}) \qquad (42)$$

where T is the integer component of the pitch delay of the current subframe and β is a pitch gain that depends on whether the frame is processed in Mode 0 or Mode 1. In Mode 0, β is the quantized pitch gain from the previous subframe because the quantized pitch gain for the current subframe is not yet available so the quantized pitch gain from the previous subframe is used to search the fixed codebook for a fixed codebook excitation vector for the current subframe. In Mode 1, β is the quantized pitch gain for the current subframe because that quantized pitch gain is available from the pre-vector quantization preceding the closed loop subframe processing and the quantized pitch gain for the current subframe is used to search the fixed codebook for a fixed codebook excitation vector for the current subframe.

Thus, in summary, in modeling the periodicity information of certain portions of a speech signal by using pitch prediction, an adaptive codebook is used. Here the pitch gain $G_P$ is derived. After modeling the periodicity information by using pitch prediction, a second residual signal remains.

Figure 8:
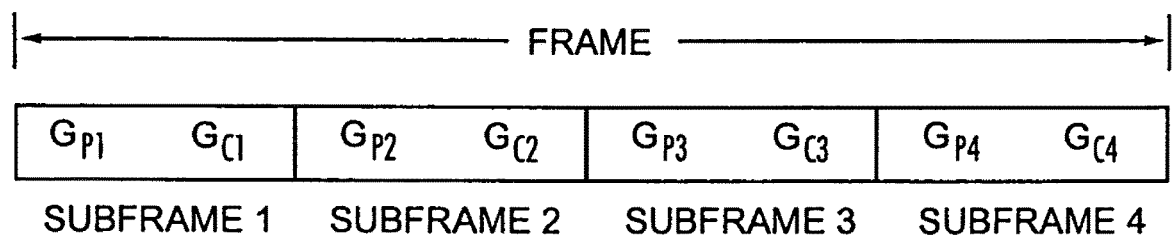
FIG. 8 is a block diagram illustrating a frame and sub-frames.
Figure 9:
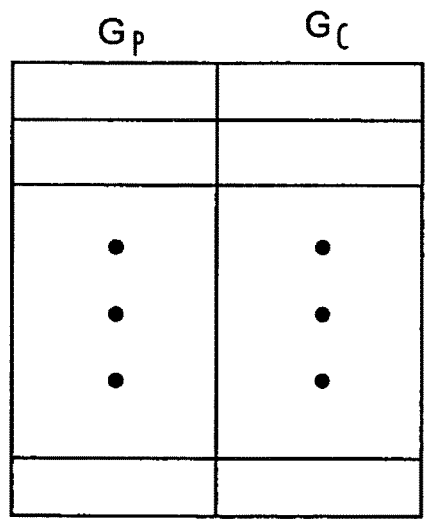
FIG. 9 is an example of a two dimensional codebook for quantizing adaptive codebook gains and fixed codebook gains.

The second residual signal is then vector quantized with a fixed codebook. The vector is scaled by the fixed codebook gain $G_C$. The adaptive codebook gain $G_P$ and fixed codebook gain $G_C$ are normally derived on a subframe basis. In the example shown in FIG. 8, a frame is divided into four subframes. Each subframe has an adaptive codebook gain $G_P$ and a fixed codebook gain $G_C$ associated with it. For example, as shown in FIG. 8, the first subframe is correlated with adaptive codebook gain $G_{P1}$ and fixed codebook gain $G_{C1}$; the second subframe is associated with gains $G_{P2}$ and $G_{C2}$; the third subframe is associated with $G_{P3}$ and $G_{C3}$; and the fourth subframe is associated with $G_{P4}$ and $G_{C4}$. At this point, a first prior art method may quantize the adaptive codebook gain $G_P$ and the fixed codebook gain $G_C$ separately for each subframe by using scalar quantization. Because scalar quantization is less efficient than vector quantization, a better prior art approach is to use a closed-loop vector quantization of the $G_P$ and $G_C$ gain values. In this second prior art approach, a $G_P$ and $G_C$ codebook, such as that shown in FIG. 9, is used to provide a vector quantization of the combination of $G_P$ and $G_C$.

A speech encoder built in accordance with the present invention, however, introduces a third approach of quantizing the adaptive codebook $G_P$ and the fixed codebook gain $G_C$. First, two modes of operation are introduced: Mode 0 and Mode 1. Second, each frame of speech is analyzed and classified as to whether the speech is "periodic." If the frame contains "periodic" speech, the pitch gains are derived from the original unquantized weighted speech signal before closed loop subframe processing begins. The improved gain quantization method performs a pre-vector quantization of the adaptive codebook gains $G_P$'s (e.g., $G_{P1}, G_{P2}, G_{P3}, G_{P4}$) of all subframes in the frame before performing subframe processing that determines the fixed codebook gains and excitation vectors. When the speech is periodic, the improved gain quantization method is able to vector quantize the gain parameters with fewer bits without suffering from significant degradation in voice quality. If the speech is not periodic, the speech sometimes can be modified to behave as if it were periodic by methods known to those of ordinary skill in the art.

The pre-vector quantization of the adaptive codebook gains $G_P$'s tries to find the closest match between the unquantized adaptive codebook gains $G_P$'s and the codebook vectors. Now that the adaptive codebook gains $G_P$'s have been vector quantized, we now discuss the fixed codebook gains $G_C$'s.

If the speech signal in the current frame is periodic, the improved gain quantization method which practices the present invention performs a closed-loop, delayed decision vector quantization of the fixed codebook gains $G_C$'s. This process takes place after completion of the subframe processing. Note that this vector quantization need not be performed on the traditional fixed codebook gains $G_C$'s as it may be performed on predicted $G_C$'s, transformed $G_C$'s, and other variations and modifications of $G_C$'s. As stated above with respect to the adaptive codebook gains $G_P$'s, if the speech is not periodic, the speech sometimes can be modified to behave as if it were periodic which results in transformed $G_C$'s and transformed $G_P$'s. Similarly, the $G_C$'s and/or $G_P$'s may be predicted values. Again, a person of ordinary skill in the art would be aware of methods to transform speech to be periodic as well as to predict $G_C$'s and/or $G_P$'s. As explained in detail above, the "delayed decision" nature of the vector quantization of the fixed codebook gains $G_C$'s means that each $G_C$ is derived separately and sequentially where they are then used to form a vector which is quantized. The decision is delayed because the process must wait to derive all of the $G_C$'s in a frame before doing vector quantization of the $G_C$'s. Thus, the improved gain quantization method performs a pre-vector quantization of the adaptive codebook gains $G_P$'s, but performs a vector quantization of the fixed codebook gains $G_C$'s in a delayed decision, closed-loop fashion for periodic speech.

A first prior art method of performing joint vector quantization of $G_P$'s and $G_C$'s is to create a vector out of each $G_P/G_C$ pair in the subframe (e.g., $(G_{P1}, G_{C1})$, $(G_{P2}, G_{C2})$, $(G_{P3}, G_{C3})$, $(G_{P4}, G_{C4})$ for a frame having four subframes) and then quantize each vector using a codebook, without a delayed decision. The first prior art method can reproduce good quality speech, but only at high bit rates.

A second prior art method jointly quantizes all of the $G_P$'s and $G_C$'s in the frame together with a delayed decision approach (e.g., $(G_{P1}, G_{P2}, G_{P3}, G_{P4}, G_{C1}, G_{C2}, G_{C3}, G_{C4})$ for a frame having four subframes). The second prior art method results in poor quality speech reproduction.

The improved gain quantization method performs the following two gain quantizations: (1) perform a pre-vector quantization of the $G_P$ for each subframe of the frame before closed loop subframe processing begins if the speech is periodic; and (2) perform a closed-loop delayed decision vector quantization of the $G_C$. As known by those of ordinary skill in the art, a closed-loop vector quantization does not find the best match in the codebook of the vector, but the best match of the speech. In the improved gain quantization method, the delayed decision nature of the vector quantization is performed only on the fixed codebook $G_C$'s and increases the compression without losing the quality of the speech. Thus, the improved speech encoder reproduces high quality speech even at a low bit rate. The vector quantization of the adaptive codebook gains $G_P$'s does not require that it be performed in a closed-loop fashion. Because the improved method performs a pre-vector quantization of the adaptive codebook gains $G_P$'s, the quantization of the $G_P$'s is more stable.

The improved speech encoder offers numerous other advantages. For example, the improved speech encoder is able to obtain the quantized adaptive codebook gains $G_P$'s for all subframes of a frame before obtaining the fixed codebook gain $G_C$ (which is obtained during closed loop subframe processing); whereas the second prior art method discussed above does not obtain the quantized $G_P$ and $G_C$ until after the encoder processes the last subframe of the frame. As a result, because the improved speech encoder obtains the quantized $G_P$ before starting the subframe processing, the value of $G_P$ does not affect the search for the best fixed codebook gain. In the second prior art method, any errors in the value of $G_P$ also affects the fixed codebook processing. Furthermore, because the quantized $G_P$ is obtained before the adaptive codebook is used, any errors in the value of $G_P$ can be corrected by the fixed codebook processing. In other words, the search through the fixed codebook will take into account the prior quantization of $G_P$ and correct for any errors in the value of $G_P$. The prior art methods are unable to do this.

Although the improved speech encoder runs Mode 1 processing only for periodic speech, periodic speech comprises roughly 60-70% of ordinary speech. Therefore, Mode 1 of the improved speech encoder will have a significant impact on the reduction of bits used for gain quantization. In theory, the improved speech encoder offers significant improvement in bit reduction. For example, assuming a frame size of 80 bits with four subframes and a data channel of 4 kbps, the prior art method requires four subframes of 7 bits each per frame, for a total of 28 bits, to represent the gain information. By contrast, the improved speech encoder may be able to represent the same information with roughly fourteen bits, a 50% improvement, as shown in FIG. 10.

In this particular embodiment, the 80 bits per frame are transmitted from the encoder to the decoder. The decoder maps the 80 bits back to the parameters of the encoder. The synthesis of the speech from the parameters is straightforward and resembles that of G.729. The post-filter is fundamentally the same as in G.729 and has both the long-term (pitch) and short-term (LPC) post-processing.

Figure 11:
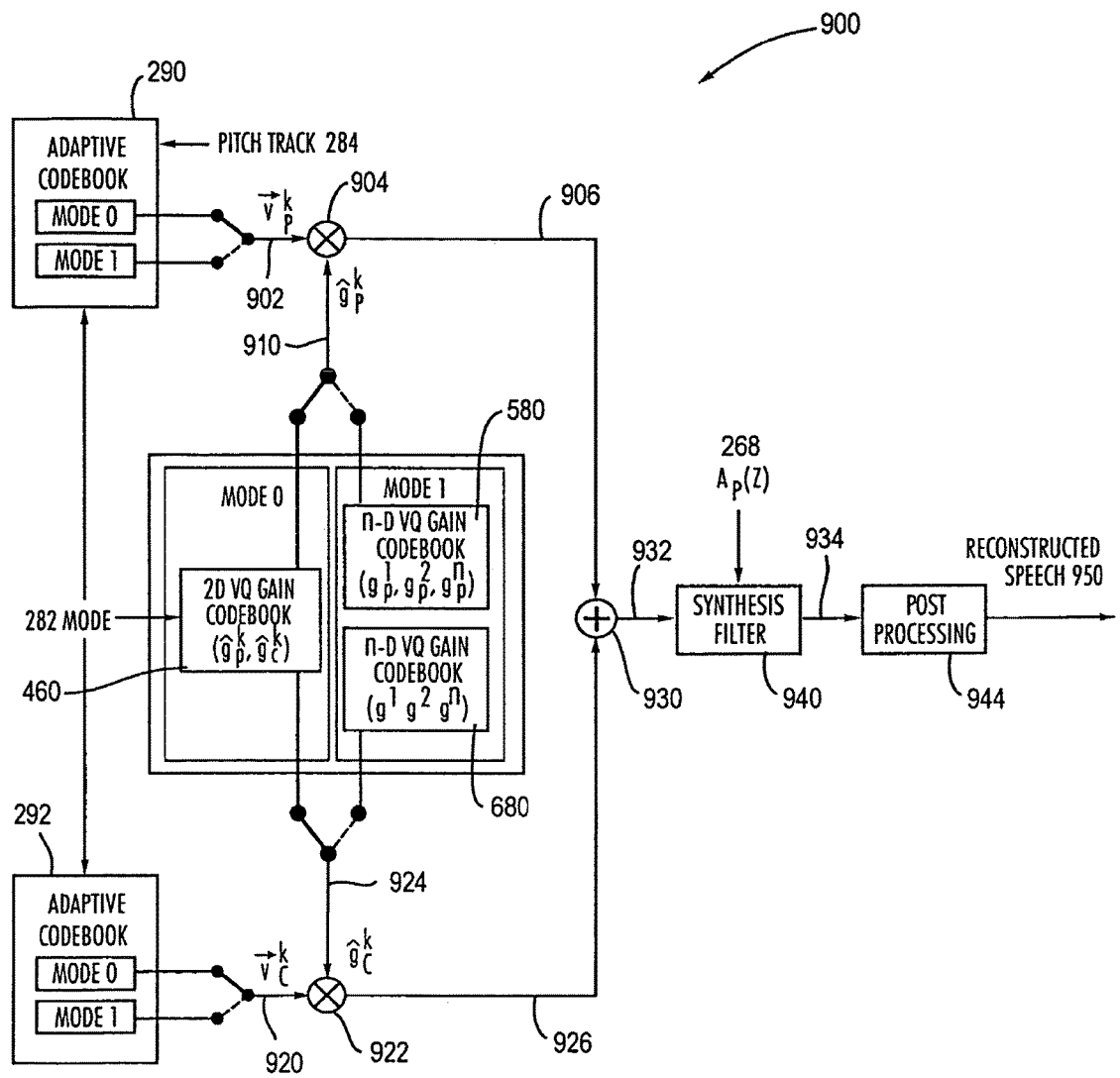
FIG. 11 is a block diagram of one embodiment of a speech decoder for processing coded information from a speech encoder built in accordance with the present invention.

FIG. 11 illustrates a block diagram of a speech decoder that corresponds with the improved speech encoder. The speech decoder performs inverse mapping of the bit-stream to the algorithm parameters followed by a mode-dependent synthesis. An adaptive codebook 290 receives pitch track information 284 (which the decoder recreates from the information sent through the communication channel from the speech encoder). Depending on the mode 282, the adaptive codebook 290 provides a quantized adaptive codebook vector $\bar{v}_P$ 902 to a multiplier 904. Multiplier 904 multiplies the quantized adaptive codebook vector $\bar{v}_P$ 902 with the pitch gain vector 910. The selection of the pitch gain vector 910 depends on the mode 282. If the Mode is 0, a two dimensional vector quantizer codebook 460 provides the pitch gain vector 910 to the multiplier 904. The codebook 460 is two dimensional because it provides a pitch gain vector 910 to the multiplier 904 and a fixed codebook gain vector 924 to a multiplier 922. Depending on the mode 282, the fixed codebook 292 provides a quantized fixed codebook vector $\bar{v}_c$ 920 to the multiplier 922. Multiplier 922 multiplies the quantized fixed codebook vector $\bar{v}_c$ 920 with the quantized fixed codebook gain vector 924. If the Mode is 1, a n-dimensional vector quantizer gain codebook 580 (where n is the number of subframes per frame) provides the pitch gain vector 910 to the multiplier 904. Likewise, a n-dimensional vector quantizer gain codebook 680 (where n is the number of subframes per frame) provides the gain vector 924 to the multiplier 922. The multiplier 904 sends its multiplied signal 906 to an adder 930 where the multiplied signal 906 is added to the multiplied signal 926 from the multiplier 922. The added signal 932 is sent to a synthesis filter 940 which also receives the quantized LPC coefficients $A_q(z)$ 268 (which the decoder derives from the information sent to it over the communication channel by the speech encoder). The synthesis filter 940 and post processor 944 together create a reconstructed speech signal 950 from the added signal 932.

Figure 12A:
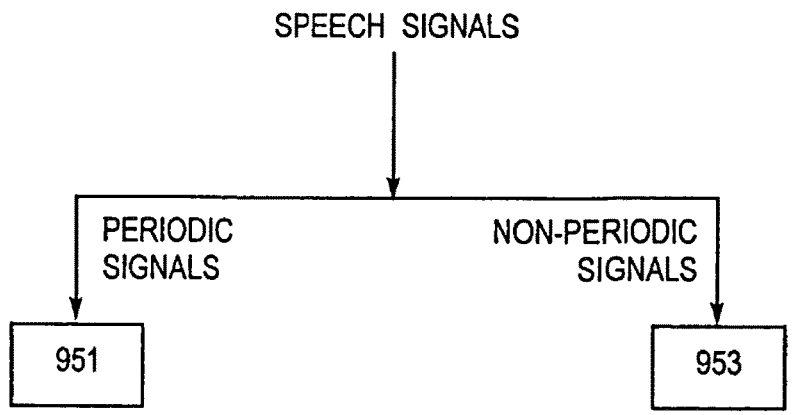
FIGS. 12a-12c are schematic diagrams of three alternative embodiments of a speech encoder built in accordance with the present invention.

As described above, the pitch gains may be derived from the original unquantized weighted speech signal. However, the pitch gains may also be derived from the unquantized LPC residual signal, the original unquantized speech signal, or the unquantized modified speech signal before closed loop subframe processing begins. FIG. 12a illustrates a block diagram of the first alternative embodiment that applies two gain quantization processing approaches depending on whether the signal is periodic or non-periodic (or periodic-like versus non-periodic-like). The new gain quantization process is used only for periodic signals as shown in block 951 and a conventional gain quantization process is used for non-periodic signals as shown in block 953 in FIG. 12a. As an example, if the conventional gain quantization process is applied to frames having four subframes, 28 bits might be allocated for gain quantization. The new gain quantization process for periodic signals might, for example, require only 16 bits be allocated. Thus, in this example, the new gain quantization strategy saves 12 bits for a frame of periodic signals, which bits can be used for other purposes if desired.

Figure 12B:
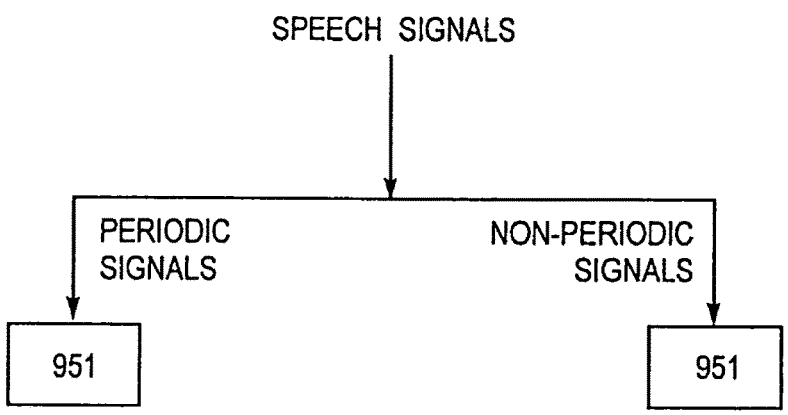

The second alternative embodiment is now discussed below with reference to the above description. Turning to FIG. 12b, the new gain quantization process (block 951) which was used only for periodic signals may be extended to non-periodic signals as well. This second strategy results in a slightly higher bit rate than that for periodic signals that use the new gain quantization strategy, but is still lower than the prior art's bit rate. This increase in bit rate in the second strategy is done to deal better with the greater variability in the gain parameters of non-periodic signals as compared to periodic signals. The same gain quantization process 951 described above for the first embodiment may be used for non-periodic signals in the second embodiment, except that more bits are allocated to represent the gain quantization of non-periodic signals. As an example, if each frame has four subframes, the new gain quantization process for periodic signals might require only 16 bits while the same approach for non-periodic signals might require only 22 bits. Thus, in this example, the new gain quantization strategy saves 12 bits for periodic signals and 6 bits for non-periodic signals in a frame.

Figure 12C:
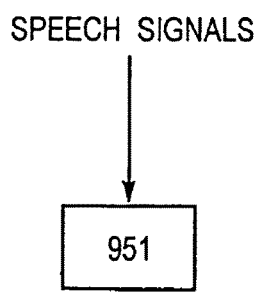

The third alternative embodiment is now discussed below with reference to the above description. Turning to FIG. 12c, the distinction between periodic and non-periodic signals may be eliminated for the gain quantization process where the new gain quantization process 951 may be used for all speech signals. Here, the new gain quantization process 951 described for non-periodic signals in the second embodiment in FIG. 12b may be used for all signals including periodic signals. However, more bits may be allocated to represent the gain quantization of these signals. As an example, if each frame has four subframes, the new gain quantization strategy might require only 22 bits which saves 12 bits per frame.

While embodiments and implementations of the subject invention have been shown and described, it should be apparent that many more embodiments and implementations are within the scope of the subject invention. Accordingly, the invention is not to be restricted, except in light of the claims and their equivalents.

What is claimed is:

1. A speech encoding system comprising:
at least one processing circuit; and
a memory storing a first vector quantization codebook and a second vector quantization codebook, and instructions executable by the at least one processing circuit to cause the speech encoding system to transform an input speech signal into an output bitstream by:
generating a plurality of subframes of a frame of the input speech signal;
generating unquantized pitch gains for the respective subframes;
selecting a mode from a plurality of modes based on the frame of the input speech signal;
in response to the mode being a first of the modes:
selecting a quantized pitch gain vector from the first vector quantization codebook based on the unquantized pitch gains, wherein the quantized pitch gain vector is selected in an open loop fashion, wherein the quantized pitch gain vector includes adaptive-codebook gain components corresponding respectively to the subframes of the frame;
performing subframe processing based on data including the quantized pitch gain vector to select a first excitation from a fixed excitation codebook; and
selecting a second gain vector from the second vector quantization codebook using the first excitation and a closed loop minimization, wherein the second gain vector includes fixed-codebook gain components corresponding respectively to the subframes of the frame;
generating the output bitstream that includes first information indicating the quantized pitch gain vector and second information indicating the second gain vector in response to the mode being the first mode; and
transmission circuitry operable to transmit the output bitstream via a radiofrequency link, wherein the output bitstream includes information that is decodable by a remote handheld device to play a reproduced version of the input speech signal.

2. The system of claim 1, wherein the first mode is selected based on a periodicity of the input speech signal being greater than a selected value.

3. The system of claim 1, wherein the first vector quantization codebook is a three-dimensional gain codebook.

4. The system of claim 1, wherein the second vector quantization codebook is an n-dimensional gain codebook, with n greater than or equal to two.

5. The system of claim 4, wherein the n-dimensional gain codebook is a three-dimensional gain codebook.

6. A method comprising:
a speech encoding system generating a plurality of subframes of a frame of an input speech signal;
the speech encoding system generating unquantized pitch gains for the respective subframes;
the speech encoding system selecting a mode from a plurality of modes based on the frame of the input speech signal;

in response to the mode being a first of the modes, the speech encoding system:
  selecting a quantized pitch gain vector from a first vector quantization codebook based on the unquantized pitch gains, wherein the quantized pitch gain vector is selected in an open loop fashion, wherein the quantized pitch gain vector includes adaptive-codebook gain components corresponding respectively to the subframes of the frame;
  performing subframe processing based on data including the quantized pitch gain vector to select a first excitation from a fixed excitation codebook; and
  selecting a second gain vector from a second vector quantization codebook using the first excitation and a closed loop minimization, wherein the second gain vector includes fixed-codebook gain components correspond respectively to the subframes of the frame;
the speech encoding system generating an output bitstream including first information indicating the quantized pitch gain vector and second information indicating the second gain vector in response to the mode being the first mode, wherein the output bitstream is a transformed version of the input speech signal; and
transmission circuity transmitting the output bitstream via a radiofrequency link, wherein the output bitstream includes information that is decodable by a remote handheld device to play a reproduced version of the input speech signal.

7. The method of claim 6, wherein the first mode is selected based on a periodicity of the input speech signal being greater than a selected value.

8. The method of claim 6, wherein the first vector quantization codebook is a three-dimensional gain codebook.

9. The method of claim 6, wherein the second vector quantization codebook is an n-dimensional gain codebook, with n greater than or equal to two.

10. The method of claim 9, wherein the n-dimensional gain codebook is a three-dimensional gain codebook.

11. A cell phone comprising:
  a receiver configured to receive a frame of encoded speech from a remote transmitter via a radiofrequency link, wherein the frame represents a portion of a speech signal;
  a mode extractor configured to extract a mode from the frame, wherein the mode is one of a plurality of modes;
  a gain extractor configured to determine a quantized pitch gain vector and a second gain vector based on information contained in the frame in response to the mode being a first of the modes, wherein the quantized pitch gain vector includes adaptive-codebook gain components corresponding respectively to subframes of the frame, wherein the quantized pitch gain vector has been selected prior to subframe processing from a first vector quantization codebook based on unquantized pitch gains for the respective subframes, wherein the second gain vector includes fixed-codebook gain components corresponding respectively to the subframes of the frame, wherein the second gain vector has been selected after the subframe processing from a second vector quantization codebook based on a fixed codebook excitation and a closed loop minimization;
  a reconstructor configured to reconstruct the portion of the speech signal based on data including the quantized pitch gain vector and the second gain vector in response to the mode being the first mode; and
  a speaker configured to play the portion of the speech signal.

12. The cell phone of claim 11, wherein the first mode corresponds to a periodicity of the speech signal being greater than a selected value.

13. A method comprising:
  a receiver receiving a frame of encoded speech from a remote transmitter via a radiofrequency link, wherein the frame represents a portion of a speech signal;
  a speech decoding system extracting a mode associated with the frame, wherein the mode is one of a plurality of modes;
  the speech decoding system determining a quantized pitch gain vector and a second gain vector based on information contained in the frame in response to the mode being a first of the modes, wherein the quantized pitch gain vector includes adaptive-codebook gain components corresponding respectively to subframes of the frame, wherein the quantized pitch gain vector has been selected by an encoder prior to subframe processing at the encoder, wherein the quantized pitch gain vector has been selected from a first vector quantization codebook based on unquantized pitch gains for the respective subframes, wherein the second gain vector includes fixed-codebook gain components corresponding respectively to the subframes of the frame, wherein the second gain vector has been selected by the encoder after the subframe processing, wherein the second gain vector has been selected from a second vector quantization codebook based on a fixed codebook excitation and a closed loop minimization;
  the speech decoding system reconstructing the portion of the speech signal based on data including the quantized pitch gain vector and the second gain vector in response to the mode being the first mode; and
  a speaker playing the portion of the speech signal.

14. The method of claim 13, wherein the first mode corresponds to a periodicity of the speech signal being greater than a selected value.

15. The system of claim 1, wherein the selecting the quantized pitch gain vector from the first vector quantization codebook is based only on the unquantized pitch gains.

* * * * *